United States Patent
Sundar

(10) Patent No.: US 6,514,033 B2
(45) Date of Patent: *Feb. 4, 2003

(54) MECHANICAL GRIPPER FOR WAFER HANDLING ROBOTS

(75) Inventor: Satish Sundar, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/960,009

(22) Filed: Sep. 21, 2001

(65) Prior Publication Data

US 2002/0009359 A1 Jan. 24, 2002

Related U.S. Application Data

(62) Division of application No. 09/272,658, filed on Mar. 18, 1999.

(51) Int. Cl.[7] .............................................. B66C 23/00
(52) U.S. Cl. ..................................... 414/744.5; 29/87.1
(58) Field of Search ...................... 414/744.5; 294/103.1, 294/87.1

(56) References Cited

U.S. PATENT DOCUMENTS

| 4,473,455 A | 9/1984 | Dean et al. ................. 204/298 |
| 4,516,318 A | 5/1985 | Kirschenman ................ 29/846 |
| 4,586,743 A | 5/1986 | Edwards et al. ............ 294/86.4 |
| 4,705,951 A | 11/1987 | Layman et al. ........... 250/442.1 |
| 4,733,632 A | 3/1988 | Ohmi et al. ................ 118/729 |
| 4,806,057 A | 2/1989 | Cay et al. ................... 414/225 |
| 4,813,732 A | 3/1989 | Klem ...................... 294/103.1 |
| 4,872,803 A | 10/1989 | Asakawa .................... 294/99.1 |
| 4,900,214 A | 2/1990 | Ben ........................... 414/416 |
| 4,944,650 A | 7/1990 | Matsumoto ................. 414/757 |
| 5,022,695 A | 6/1991 | Ayers .......................... 294/88 |

(List continued on next page.)

FOREIGN PATENT DOCUMENTS

| EP | 0 445 651 A2 | 2/1991 | ........... H01L/21/00 |
| EP | 0 423 608 A1 | 4/1991 | .............. B25J/9/12 |
| EP | 0 793 262 A2 | 9/1997 | ........... H01L/21/00 |

OTHER PUBLICATIONS

PCT International Search Report, Dated Jan. 05, 1999.
Sundar, Satish, "Improved Throughput Using Time–Optimal Motion Planning and Design".

*Primary Examiner*—Donald W. Underwood
(74) *Attorney, Agent, or Firm*—Moser, Patterson & Sheridan

(57) ABSTRACT

The present invention generally provides a robot that can transfer workpieces, such as silicon wafers, at increased speeds and accelerations and decelerations. More particularly, the present invention provides a robot wrist associated with the robot arm for mechanically clamping a workpiece to a workpiece handling member attached to the arm. The workpiece clamp selectively applies sufficient force to hold the workpiece and prevent slippage and damage to the workpiece during rapid rotation and linear movement of the handling member. In one embodiment, a clamp for securing silicon wafers uses two clamp fingers connected to a single flexure member to position and hold the wafer with minimal particle generation and wafer damage. The clamp is designed so that wafers are normally clamped except near full extension of the workpiece handling member to deliver or pick up a wafer.

15 Claims, 15 Drawing Sheets

U.S. PATENT DOCUMENTS

| | | | |
|---|---|---|---|
| 5,046,909 A | 9/1991 | Murdoch | 414/225 |
| 5,133,635 A | 7/1992 | Malin et al. | 414/744.8 |
| 5,180,276 A | 1/1993 | Hendrickson | 414/752 |
| 5,280,983 A | 1/1994 | Maydan et al. | 294/119.1 |
| 5,324,155 A | 6/1994 | Goodwin et al. | 414/225 |
| 5,374,147 A | 12/1994 | Hiroki et al. | 414/217 |
| 5,429,733 A | 7/1995 | Ishida | 204/244 R |
| 5,447,409 A | 9/1995 | Grunes et al. | 414/744.6 |
| 5,469,035 A | 11/1995 | Lowrance | 318/568.1 |
| 5,520,501 A | 5/1996 | Kouno et al. | 414/741 |
| 5,605,866 A | 2/1997 | McClanahan et al. | 437/225 |
| 5,637,200 A | 6/1997 | Tsymberov | 204/298.15 |
| 5,647,626 A | 7/1997 | Chen et al. | 294/87.1 |
| 5,702,228 A | 12/1997 | Tamai et al. | 414/744.5 |
| 5,711,646 A | 1/1998 | Ueda et al. | 414/225 |
| 5,720,590 A | 2/1998 | Hofmeister | 414/744.2 |
| 5,733,096 A | 3/1998 | Van Doren et al. | 414/744.3 |
| 5,804,089 A | 9/1998 | Suzuki et al. | 216/71 |
| 5,838,121 A | 11/1998 | Fairbairn et al. | 318/45 |
| 5,955,858 A | 9/1999 | Kroeker et al. | 318/568.11 |
| 5,980,187 A | 11/1999 | Verhovsky | 414/416 |
| 6,116,848 A | 9/2000 | Thomas et al. | 414/754 |
| 6,155,773 A | 12/2000 | Ebbing et al. | 414/774.5 |
| 6,222,337 B1 | 4/2001 | Kroeker et al. | 318/568.11 |
| 6,256,555 B1 | 7/2001 | Bacchi et al. | 700/245 |

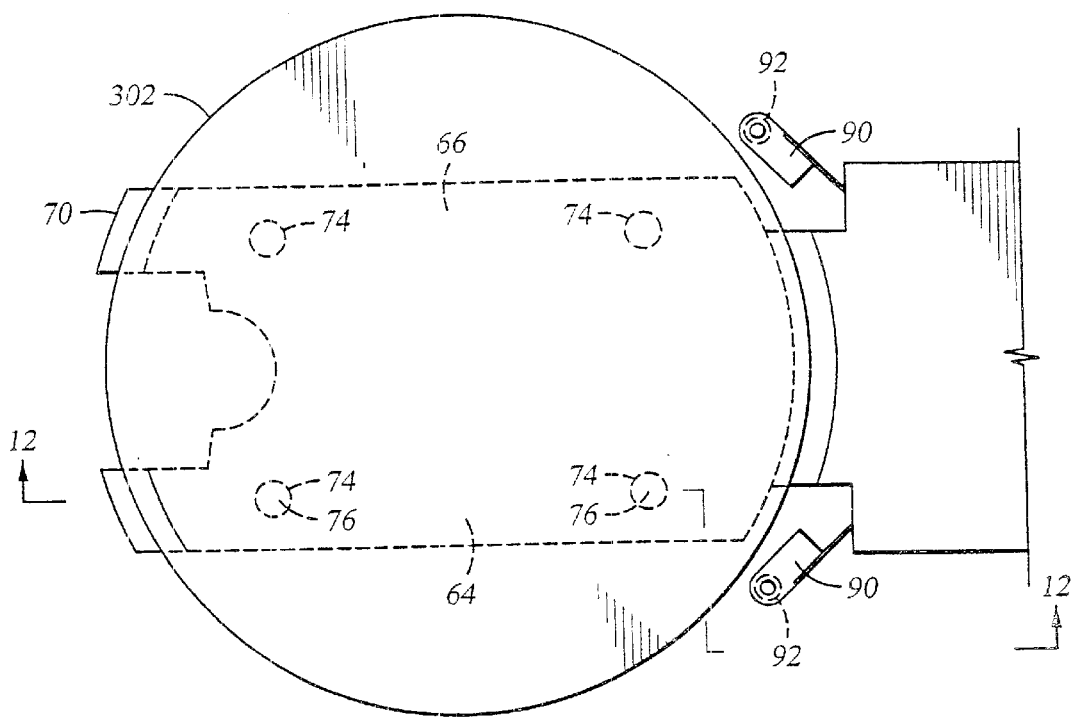
*Fig. 11*
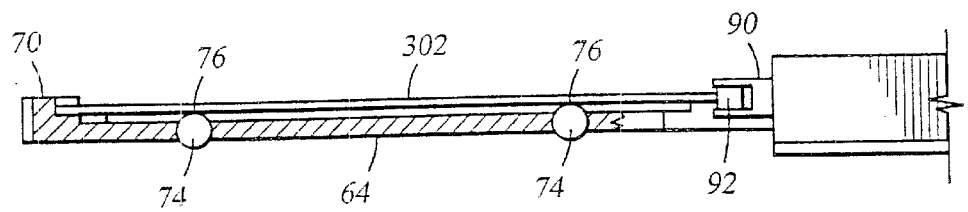
*Fig. 12*
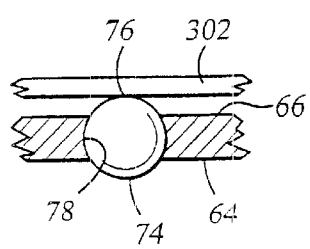 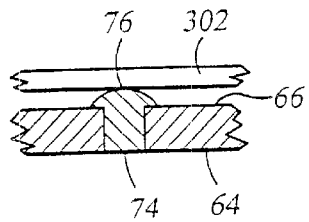 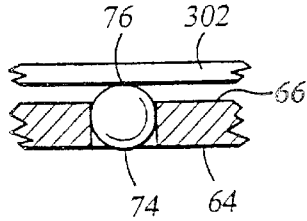
*Fig. 13A*   *Fig. 13B*   *Fig. 13C*

MECHANICAL GRIPPER FOR WAFER HANDLING ROBOTS

CROSS-REFERENCE TO RELATED APPLICATIONS

This application is a divisional of U.S. patent application Ser. No. 09/272,658 filed on Mar. 18, 1999, which has issued as U.S. Pat. No. 6,322,312.

BACKGROUND OF THE INVENTION

1. Field of the Invention

The present invention relates to a clamping mechanism that secures a workpiece to a mechanical arm. More particularly, the present invention relates to a clamp that gently secures a semiconductor wafer to a robot blade by biasing the wafer against a retaining member at the forward edge of the blade when the robot blade is at least partially retracted for rotation.

2. Background of the Related Art

Modem semiconductor processing systems include cluster tools which integrate a number of process chambers together in order to perform several sequential processing steps without removing the substrate from a highly controlled processing environment. These chambers may include, for example, degas chambers, substrate preconditioning chambers, cooldown chambers, transfer chambers, chemical vapor deposition chambers, physical vapor deposition chambers, etch chambers, and the like. The combination of chambers in a cluster tool, as well as the operating conditions and parameters under which these chambers are run, are selected to fabricate specific structures using a specific process recipe and process flow.

Once the cluster tool has been set up with a desired set of chambers and auxiliary equipment for performing certain process steps, the cluster tool will typically process a large number of substrates by continuously passing substrates through a series of chambers and process steps. The process recipes and sequences will typically be programmed into a microprocessor controller that will direct, control, and monitor the processing of each substrate through the cluster tool. Once an entire cassette of wafers has been successfully processed through the cluster tool, the cassette may be passed to yet another cluster tool or stand alone tool, such as a chemical mechanical polisher, for further processing.

Typical cluster tools process substrates by passing the substrates through a series of process chambers. In these systems, a robot is used to pass the wafers through a series of processing chambers. Each of the processing chambers is constructed to accommodate and process two wafers at a time. In this way, throughput of substrates in the cluster tool is effectively doubled. The amount of time required by each process and handling step has a direct impact on the throughput of substrates per unit of time. While the exact design of an integrated circuit fabrication system may be complex, it is almost always beneficial to perform each step as quickly as possible to maximize overall throughput without detrimentally affecting product quality, operating costs, or the life of the equipment.

Substrate throughput in a cluster tool can be improved by increasing the speed of the wafer handling robot positioned in the transfer chamber. As shown in FIG. 1, the magnetically coupled robot comprises a frog-leg type connection or arms between the magnetic clamps and the wafer blades to provide both radial and rotational movement of the robot blades in a fixed plane. Radial and rotational movements can be coordinated or combined in order to pick up, transfer, and deliver substrates from one location within the cluster tool to another, such as from one chamber to an adjacent chamber.

Another exemplary robot is shown in FIG. 2. FIG. 2 shows a conventional polar robot with an embodiment of the substrate clamping apparatus of the present invention. As shown in FIG. 2, like the "frog-leg" type robot of FIG. 1, radial and rotational movements may be coordinated or combined in order to pick up, transfer, and deliver substrates from one location within a cluster tool to another, such as from one chamber to an adjacent chamber. However, unlike the robot in FIG. 1, the robot shown in FIG. 2 may also provide translational movement of wafer 302.

As the robot speed and acceleration increase, the amount of time spent handling each substrate and delivering each substrate to its next destination is decreased. However, the desire for speed must be balanced against the possibility of damaging the substrate or the films formed thereon. If a robot moves a substrate too abruptly, or rotates the wafer blade too fast, then the wafer may slide off the blade, potentially damaging both the wafer and the chamber or robot. Further, sliding movements of the substrate on the wafer blade may create particle contaminants which, if received on a substrate, can contaminate one or more die and, thereby, reduce the die yield from a substrate. In addition, movement of the substrate on the wafer blade may cause substantial misalignment of the substrate that may result in inaccurate processing or even additional particle generation when the substrate is later aligned on the support member in the chamber.

The robot blade is typically made with a wafer bridge on the distal end of the wafer blade that extends upwardly to restrain the wafer from slipping over the end. However, the wafer bridge does not extend around the sides of the blade and does very little to prevent the wafer from slipping laterally on the blade. Furthermore, the wafers are not always perfectly positioned against the bridge. Sudden movement or high rotational speeds may throw the wafer against the bridge and cause damage to the wafer or cause the wafer to slip over the bridge and/or off the blade.

There is a certain amount of friction that exists between the bottom surface of a wafer and the top surface of the wafer blade that resists slippage of the wafer. However, the bottom surface of a silicon wafer is very smooth and has a low coefficient of friction with the wafer blade, which is typically made of nickel plated aluminum, stainless steel or ceramic. Furthermore, a typical wafer is so lightweight that the total resistance due to friction is easily exceeded by the centrifugal forces applied during rapid rotation of the robot, even when the blade is in the fully retracted position. However, this low coefficient of friction is typically relied upon when determining the speed at which a robot rotates.

Patent application Ser. No. 08/935,293, entitled "Substrate Clamping Apparatus," filed on Sep. 22, 1997, which is hereby incorporated by reference discusses the problem of wafer slippage on a robot blade and the need to increase wafer transfer speeds. This application describes a clamping mechanism that holds the substrate on the blade during transfer. However, that invention is directed to a complex lever/flexure system to engage and disengage the clamp fingers.

There is a need for a robot that can transfer wafers at increased speeds and acceleration/decelerations, particularly in a multiple or single substrate processing system. More specifically, there is a need for a wafer clamping mechanism on a robot that can secure a wafer or a pair of wafers on a wafer blade or a pair of wafer blades with sufficient force to prevent wafer slippage and wafer damage during rapid rotation and radial movement.

SUMMARY OF THE INVENTION

In one aspect, the present invention is directed to a clamp wrist for a robot assembly having one or more arms and one or more actuators for driving the arms to handle a workpiece, comprising a wrist housing pivotally coupled to the arms; at least one clamp finger disposed in the wrist housing; and a biasing member coupled to the at least one clamp finger for urging the at least one clamp finger against the workpiece. A particular feature of this aspect of the invention is that a translational member may be coupled to at least one of the arms; and a contact pad may be movably connected to the clamp finger. Further, the clamp finger may be pivotally mounted to the wrist housing; and the contact pad may be positioned to move the clamp finger away from the workpiece when the robot arm reaches a given degree of extension. Further, a stop member may be attached to the wrist housing and adapted and positioned to limit the movement of the clamp finger away from the workpiece. Still further, the biasing member may be one spring, and two clamp fingers may be mounted in spaced relation to one another and the spring may be attached to the clamp fingers.

In another aspect, a translational member may be coupled to at least one of the arms; a flexure member may be movably connected to at least one clamp finger; and a contact pad may be coupled to the flexure member and adapted and positioned to engage at least one clamp finger and move at least one clamp finger away from the workpiece when the robot arm reaches a given degree of extension. Further, two clamp fingers may be mounted in spaced relation to one another; and the flexure member may be attached to the clamp fingers and adapted to cause the clamp fingers to move apart and away from the workpiece upon engagement of the translational member with the contact pad. Still further, a lever may be pivotally mounted to the wrist housing and adapted and positioned to engage the contact pad of the flexure member upon engagement of the lever by the translational member.

In another aspect, the present invention is directed to a clamping mechanism for securing a workpiece to a workpiece handling member coupled to the distal end of a robot arm, the workpiece handling member comprising a wafer handling blade having a workpiece receiving region and a retaining member at the distal end thereof, comprising at least one clamp finger adapted and positioned to contact the edge of the workpiece and a biasing member coupled to at least one clamp finger adapted to urge the clamp finger against the workpiece when the workpiece is positioned on the workpiece receiving region to clamp the workpiece between the clamp finger and the retaining member. A feature of this aspect of the invention is that the clamping mechanism may comprise a lever arrangement coupled to the clamp finger adapted to move the clamp finger away from the workpiece when the workpiece handling member and the robot arm are extended. Another feature of this aspect of the invention is that the lever arrangement may be adapted to be engaged by the relative angular rotation between the robot arm and the workpiece handling member; the clamp finger may be pivotally mounted to the workpiece handling member; and a translational member may be attached to the robot arm positioned and adapted to engage the clamp finger and move the clamp finger away from the workpiece when the robot arm reaches a given degree of extension. Yet another feature of this aspect of the present invention is that the lever arrangement may further comprise: a flexure member movably connected to the clamp finger; and a contact pad coupled to the flexure member for selective engagement with the translational member, and adapted and positioned to engage the clamp finger and move the least one clamp finger away from the workpiece when the robot arm reaches a given degree of extension. Still another feature of this aspect of the present invention is that the lever arrangement may further comprise a lever pivotally mounted to the workpiece handling member. The lever may have an end portion; a contact pad may be coupled to the lever proximate the end portion for selective mating with the translational member; and the contact pad of the flexure member may be positioned for selective mating with the lever, whereby engagement of the lever by the translational member causes engagement of at least one clamp finger to move the clamp finger away from the workpiece when the robot arm reaches a given degree of extension. Further, two clamp fingers may be mounted in spaced relation to one another; and the flexure member may be attached to the clamp fingers and adapted to cause the clamp fingers to move apart upon engagement of the translational member with the contact pad. Still further, a stop member may be attached to the workpiece handling member and adapted and positioned to limit the movement of the at least one clamp finger away from the workpiece.

In yet another aspect, the present invention may be directed to a robot arm assembly, comprising: a pair of frog-leg type robot arms, each arm having a distal end with a clamp wrist attached thereto; the clamp wrist comprising a wrist housing pivotally coupled to the robot arm; at least one clamp finger disposed in the wrist housing; and a biasing member coupled to the at least one clamp finger adapted to urge the at least one clamp finger against a workpiece. A feature of this aspect of the invention is that a translational member may be attached to the distal end of the robot arm; and a lever arrangement may be connected to the at least one clamp finger and adapted and positioned for engagement by the translational member to cause the at least one clamping finger to move away from the workpiece when the robot arm reaches a given degree of extension. Another feature of this aspect of the present invention is that a stop member may be attached to the wrist housing and adapted and positioned to limit the movement of the at least one clamp finger away from the workpiece.

In still another aspect, the present invention may be directed to a robot, comprising a pair of first hub members rotatable about a first axis; a pair of magnetic drives for driving each of the hub members; a pair of robot arms, each robot arm comprising a first and second strut, the first strut mounted to a hub member; a translational member disposed on each of the second struts; a workpiece handling member pivotally attached to the pair of robot arms, the workpiece handling member comprising at least one clamp finger; a biasing member coupled to the at least one clamp finger adapted to urge the at least one clamp finger against a workpiece; a lever arrangement adapted and positioned to engage the at least one clamp finger in response to engagement by the translational member when the attached arm assembly reaches a given degree of extension; and the lever arrangement adapted to pull the at least one clamp finger away from the workpiece when the attached arm assembly reaches a given degree of extension. A feature of this aspect of the invention is that the biasing member is at least one spring. Another feature of this aspect of the invention is that a lever may be pivotally mounted to the wrist housing and a stop member may be attached to the wrist housing and adapted and positioned to limit the movement of the at least one clamp finger away from the workpiece. Another feature of this aspect of the present invention is that rotations of the first and second arms in a same direction may be converted into one of the two independent motions and rotations of the first and second arms in opposite directions may be converted into another of the two independent motions.

In yet another aspect, the present invention may be directed to a robot arm assembly, comprising a pair of frog-leg type robot arms, each arm having a distal end with a clamp wrist attached thereto; the clamp wrist comprising a wrist housing pivotally coupled to the robot arm; a plurality of opposing clamp fingers operatively connected to the wrist housing; and a biasing member coupled to the clamp fingers adapted to urge the clamp fingers against a workpiece. A feature of this aspect of the invention is that the opposing clamp fingers may include a first, proximal clamp finger or set of clamp fingers and a second distal clamp finger or set of clamp fingers. Another feature of this aspect of the invention is that a common linkage may be attached or otherwise operatively connected to the opposing clamp fingers to engage and/or disengage the clamp fingers. Another feature of this aspect of the invention is that the common linkage may be a length of wire, a segment of spring steel, or other suitable members.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 11 and 12 are top and cross sectional views of a wafer blade having a plurality of wafer support members.

FIG. 13A is a magnified partial cross sectional view of the wafer blade and a wafer support member as indicated in FIG. 9.

FIG. 13B and 13C are magnified partial cross sectional views of alternate wafer support members that may be used instead of, or in combination with, the wafer support member of.

DETAILED DESCRIPTION OF THE PREFERRED EMBODIMENT

Figure 1:
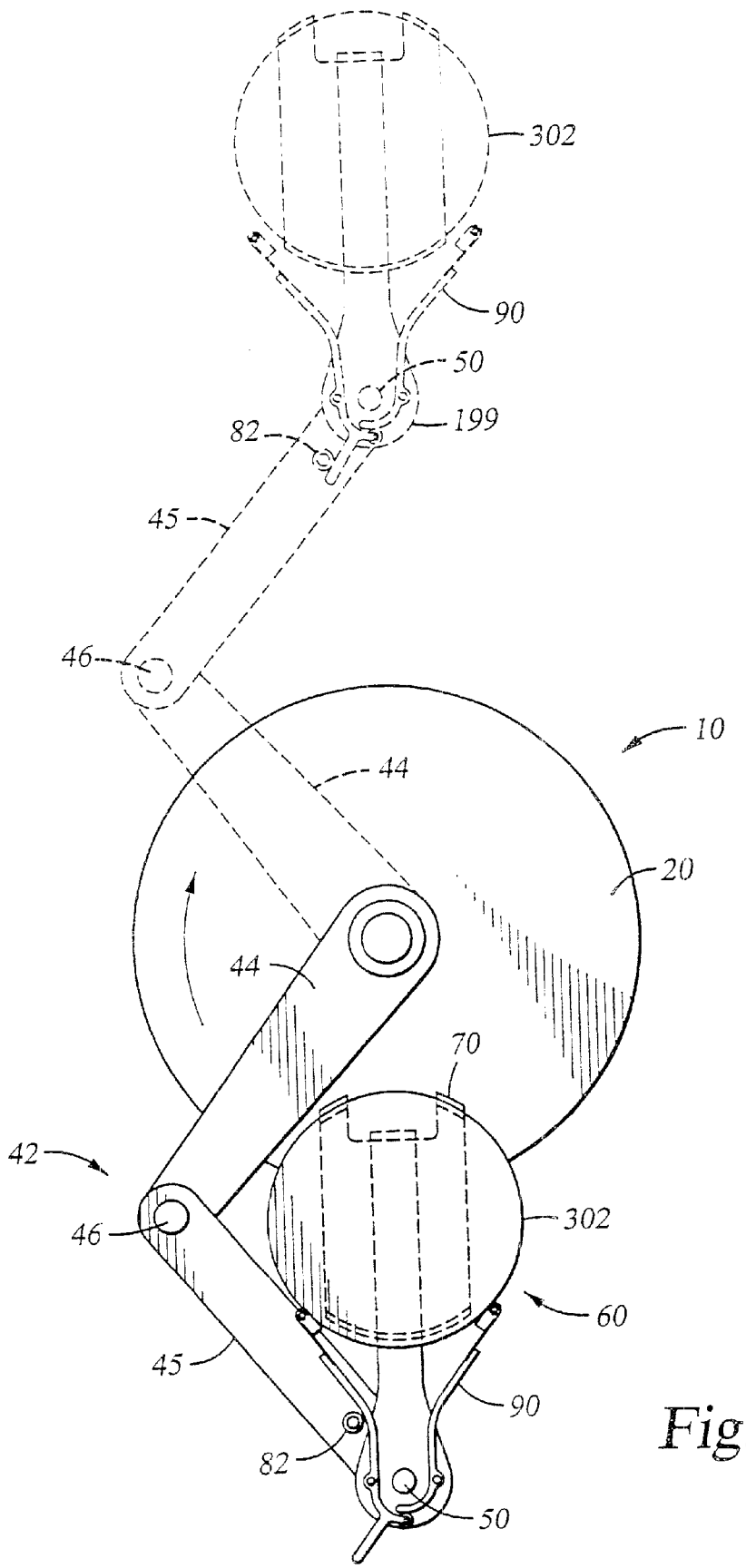
FIG. 1 is a top schematic view of a "polar" type robot arm for wafer handling showing the robot in retracted position and also showing the robot in extended position in phantom.

FIG. 1 is a schematic view of a "polar" type robot shown in a retracted position and shown in phantom in an extended position. The robot 10 includes a single robot arm 42 including a first strut 44 rigidly connected to a drive member 20. A second strut 45 of the robot arm 42 is pivotally connected to the first strut 44 by an elbow pivot 46 and by a wrist pivot 50 to a workpiece handling member 60. The structure of struts, 44 and 45, and pivots, 46 and 50, form a "polar" type robot arm 42 connecting the wafer handling member 60 to the drive member 20.

Basic operation of "polar" type robots are conventional. First strut 44 moves rotationally in one of two modes. In a rotational mode, a linkage between the drive member 20 and second strut 45 and wafer handling member 60, is disengaged so that upon rotation of first strut 44, the entire robot arm 42 rotates without extension or retraction. In an extension mode, a linkage between the drive member 20 and second struts 45 and wafer handling member 60 is engaged so that, for example, as first strut 44 rotates clockwise, second strut 45 rotates counterclockwise and wafer handling member 60 rotates clockwise. This counter-rotation of the respective struts causes extension of the wafer handling member 60 with respect to the robot 10. Reversal of the drive 20 causes first and second struts 44, 45 and wafer handling member 60 to rotate in the reverse directions to cause retraction of the wafer handling member 60.

Figure 2:
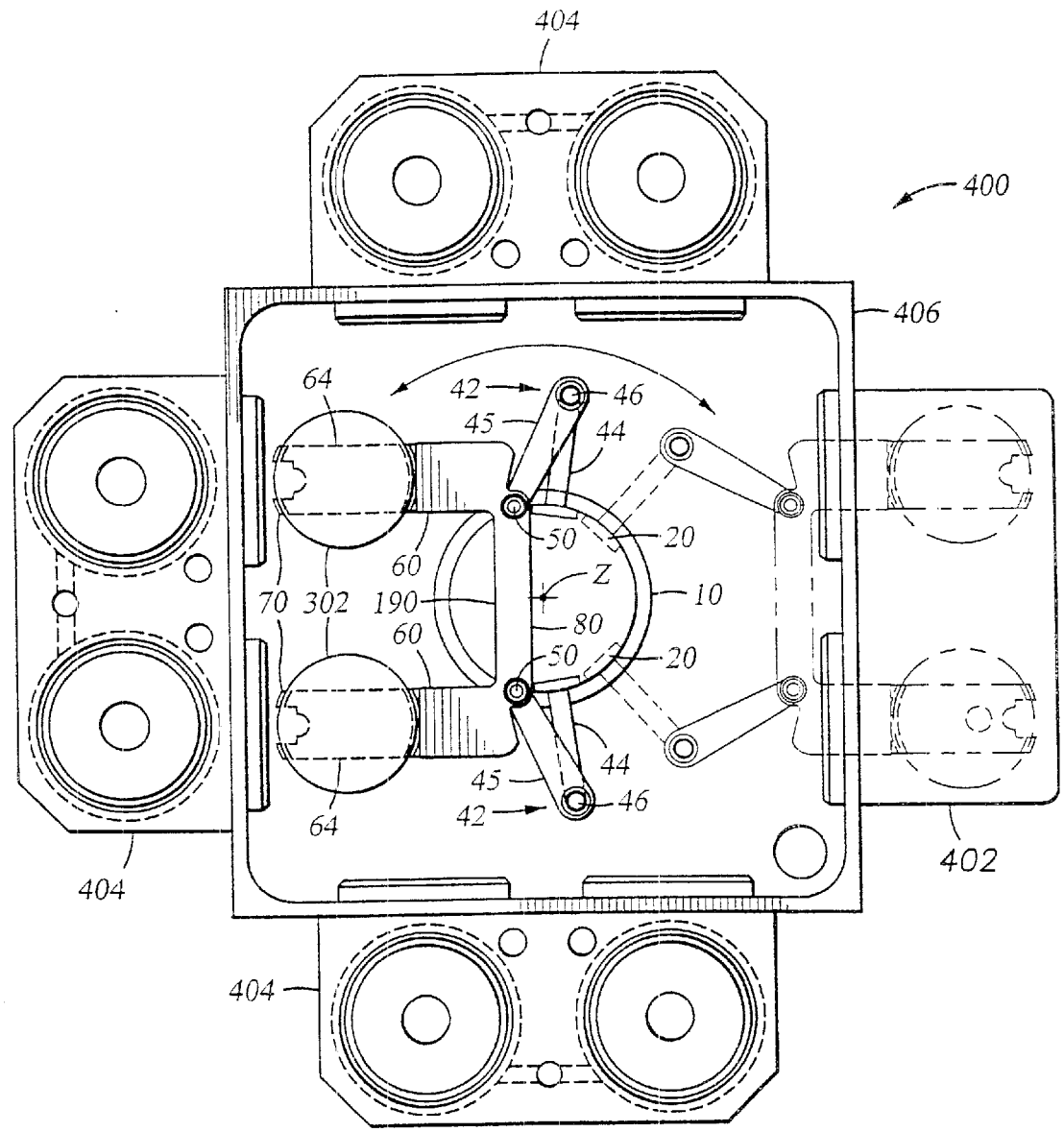
FIG. 2 is a top schematic view of a cluster tool having a "frog-leg" type robot for wafer handling showing the robot in retracted position and also showing the robot in extended position in phantom.

FIG. 2 shows a schematic diagram of an exemplary integrated cluster tool 400 useful for processing wafers 302 in tandem. Wafers 302 are introduced into and withdrawn from the cluster tool 400 through a loadlock chamber 402. A robot 10 having a pair of wafer handling blades 64 is located within the cluster tool 400 to transfer the substrates between the loadlock chamber 402 and the various process chambers 404. The robot arms 42 are illustrated in a retracted position so that the robot assembly can rotate freely within the transfer chamber 406. The specific configuration of the cluster tool in FIG. 2 is merely illustrative and the system shown is capable of processing two wafers 302 at one time. However, the invention is equally applicable to single wafer transfer or robot assemblies such as the "polar" type robot described above and shown in FIG. 1. In a preferred aspect of the invention, a microprocessor controller is provided to control the fabricating process sequence, conditions within the cluster tool, and operation of the robot 10.

FIG. 2 also illustrates a "frog-leg" type, magnetically-coupled robot 10 shown in a retracted position and shown in phantom in an extended position. The robot 10 comprises two concentric rings magnetically coupled to computer-controlled drive motors for rotating the rings about a common axis. The robot 10 includes a pair of robot arms 42 each including a first strut 44 rigidly connected to a first magnetic drive 20. A second strut 45 of the robot arm 42 is pivotally connected to the first strut 44 by an elbow pivot 46 and by a wrist pivot 50 to a workpiece handling member 60 and to a common rigid connecting member 190. The structure of struts, 44 and 45, and pivots, 46 and 50, form a "frog-leg" type robot arm robot arm 42 connecting the wafer handling members 60 to the magnetic drives 20.

When the magnetic drives 20 rotate in the same direction with the same angular velocity, the robot 10 also rotates about its rotational axis z, which is perpendicular to the plane of the diagram, in this same direction with the same angular velocity. When the magnetic drives 20 rotate in opposite directions with the same angular velocity, there is linear radial movement of the wafer handling members 60 to or from an extended position. The mode in which both motors rotate in the same direction at the same speed can be used to rotate the robot 10 from a position suitable for wafer exchange with one of the adjacent chambers to a position suitable for wafer exchange with another chamber. The mode in which both motors rotate with the same speed in opposite directions is then used to extend the wafer blade radially into one of the chambers and then extract it from that chamber. Some other combinations of motor rotation can be used to extend or retract the wafer blade as the robot is being rotated about axis x. A connecting member 190 attached at the pivot 50 to the second strut 45 and the workpiece handling members 60 extends between and connects the two workpiece handling members 60 and the robot arms 42. The assembly of connecting member 190 and workpiece handling member 60 is collectively referred to as the wrist 80. Movement of one arm assembly 42 relative to the support 190 is symmetrically duplicated by the other arm assembly 42 by means of a synchronization mechanism in connecting support 190, such as a gear or belt mechanism.

Figure 3:
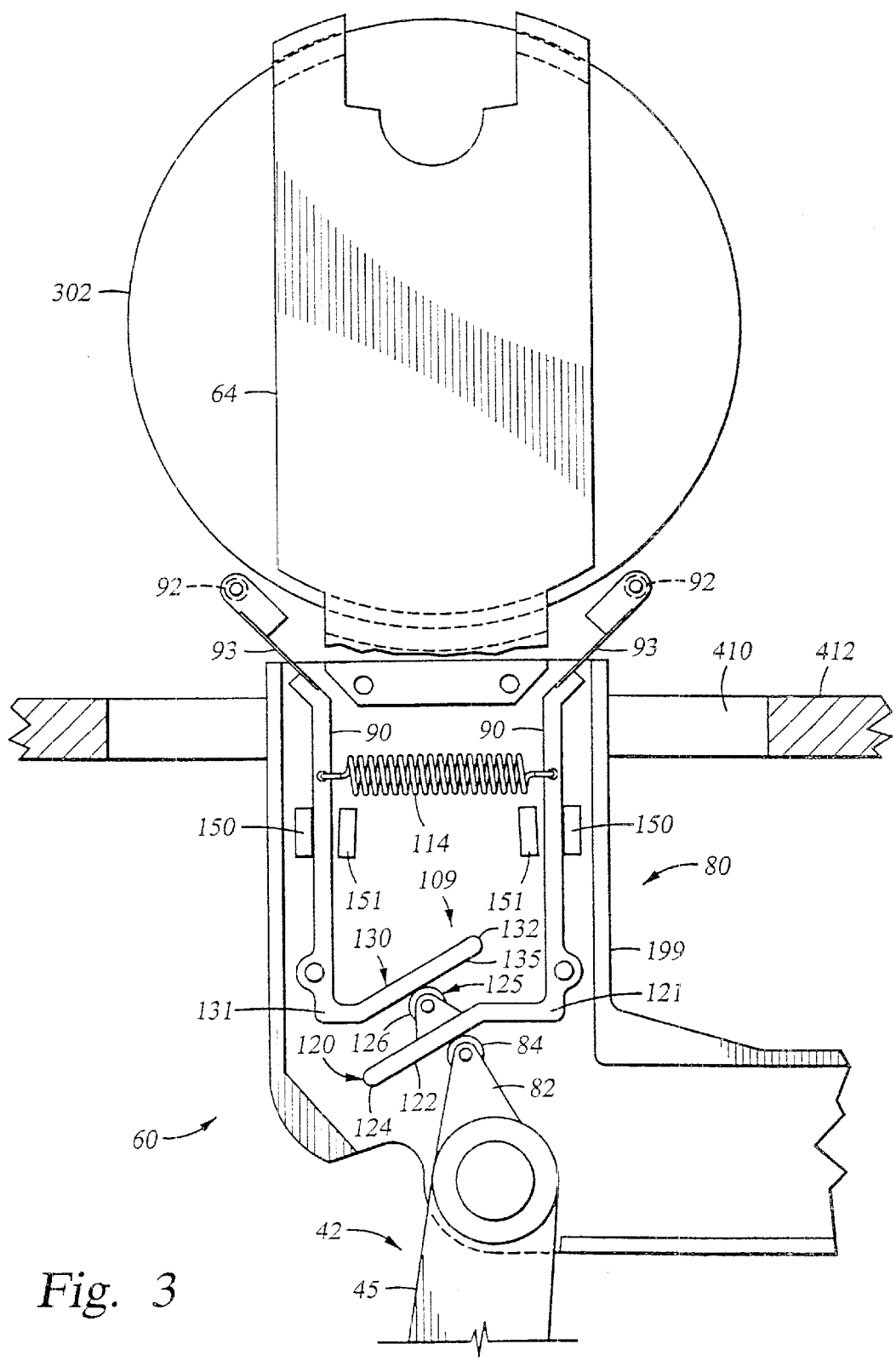
FIG. 3 is a bottom view of the clamp wrist assembly of a "frog-leg" type robot with the bottom cover plate partially removed, showing a first embodiment of the lever arrangement of the present invention in a release position near full extension.
Figure 4:
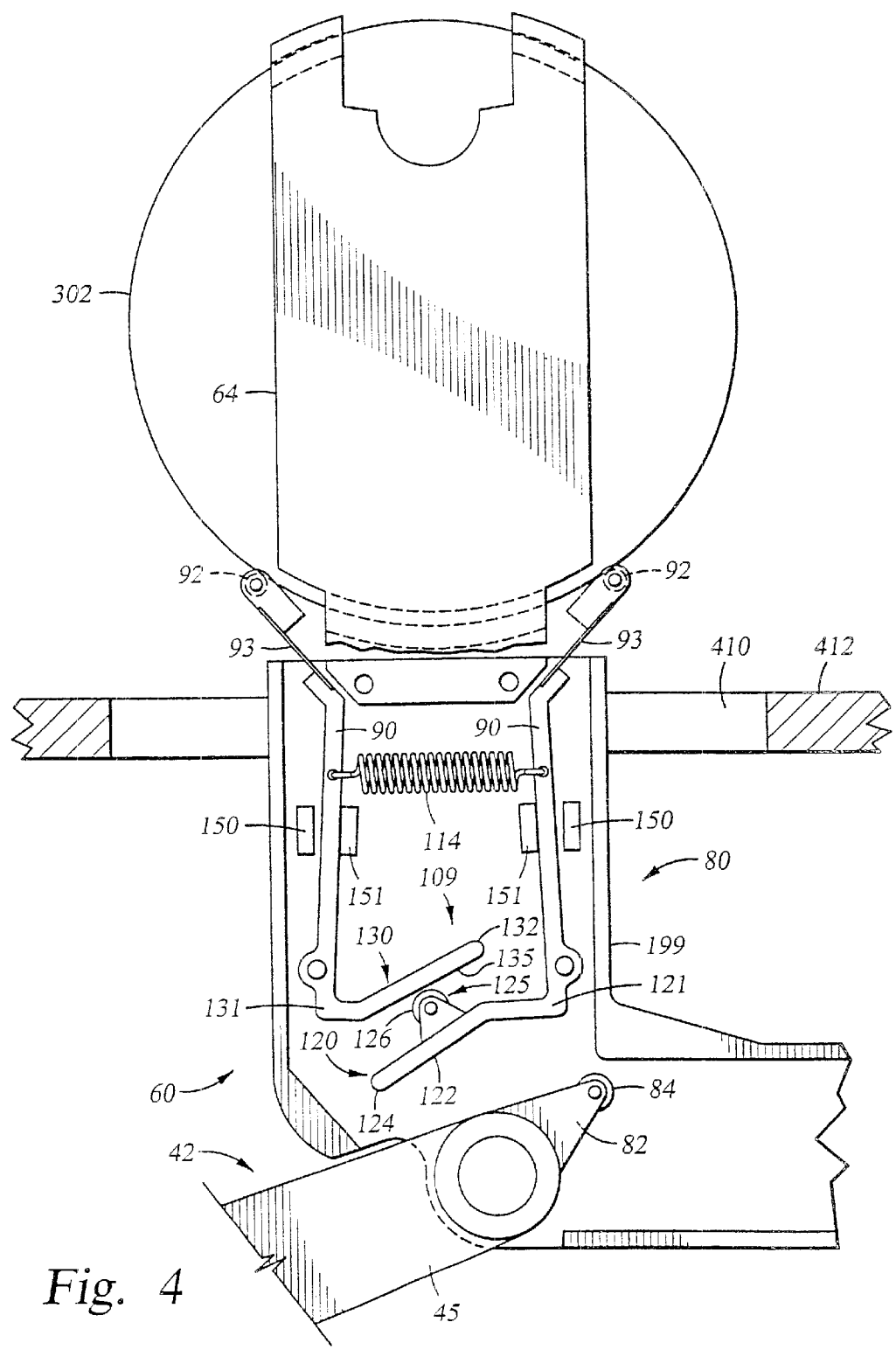
FIG. 4 is a bottom view of the clamp wrist assembly of a "frog-leg" type robot with the bottom cover plate partially removed, showing a first embodiment of the lever arrangement of the present invention in a partially retracted, clamped, position.
Figure 5:
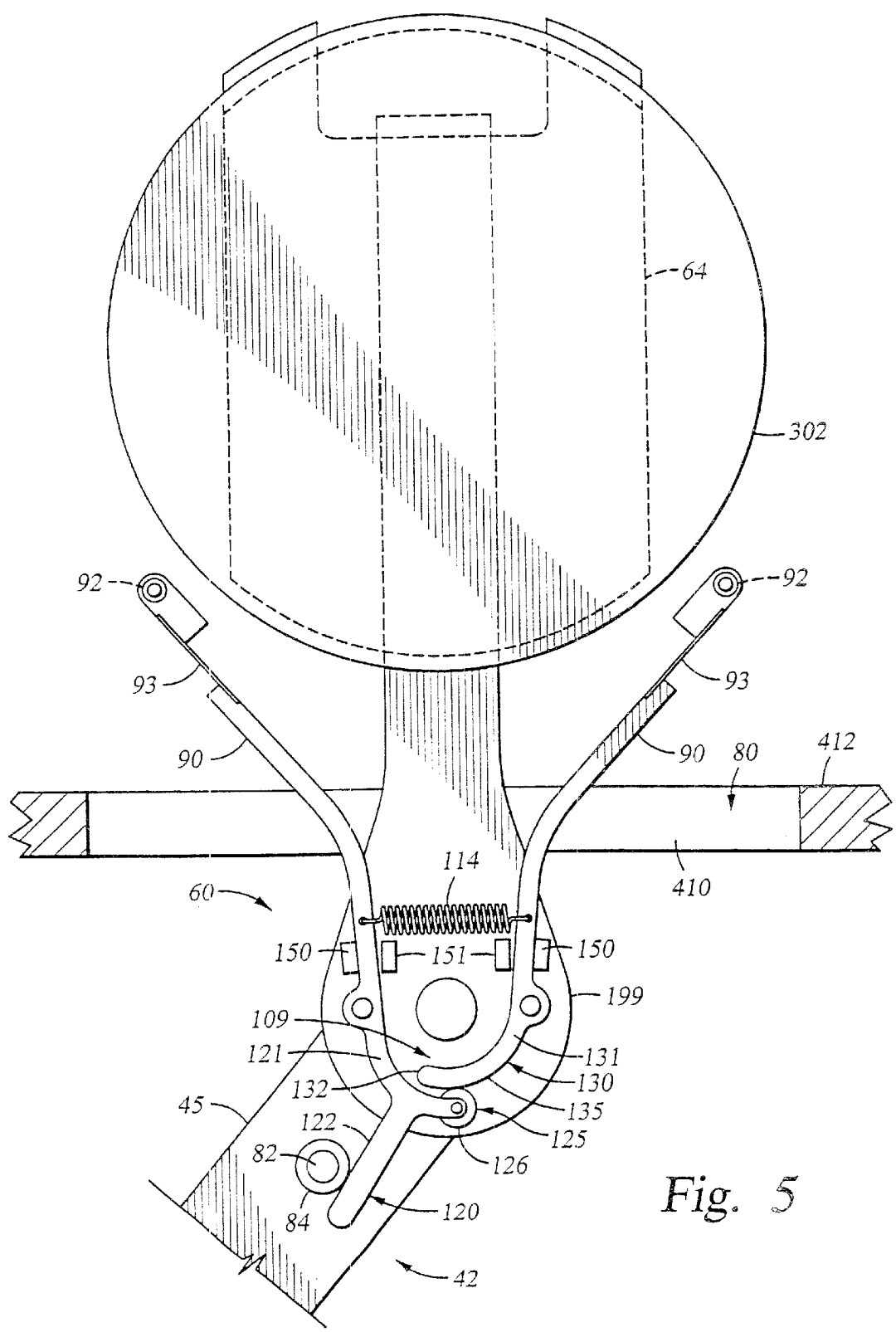
FIG. 5 is a top view of the clamp wrist assembly of a "polar" type robot with no cover plate, showing a second embodiment of the lever arrangement of the present invention in a release position near full extension.
Figure 6:
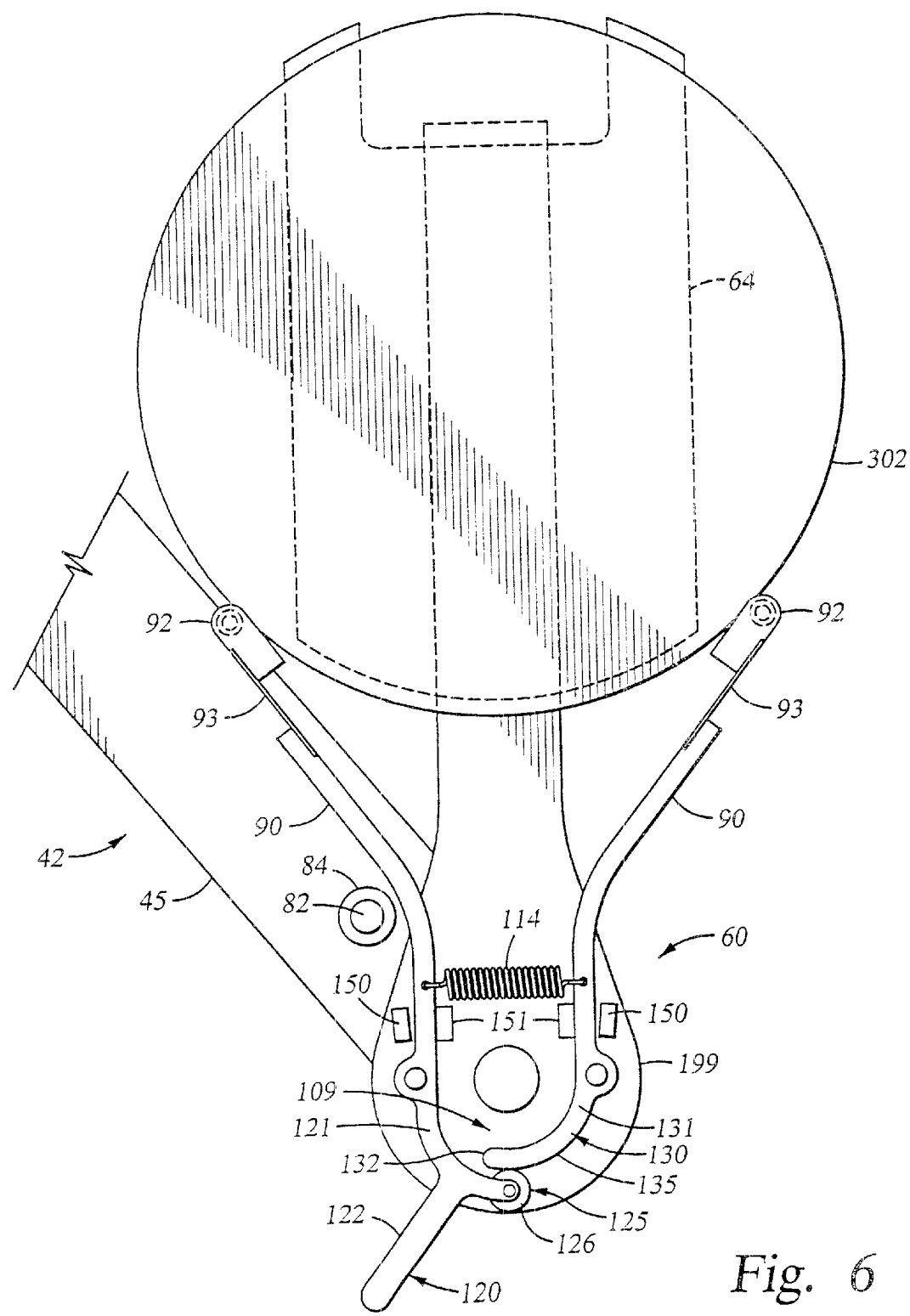
FIG. 6 is a top view of the clamp wrist assembly of a "polar" type robot with no cover plate, showing a second embodiment of the lever arrangement of the present invention in a partially retracted, clamped, position.

FIGS. 3 and 4 show a partial bottom view of a first embodiment of a workpiece handling member 60 with the bottom cover plates partially removed and illustrate the internal working components of the clamp wrist 80 adapted for use on a "frog-leg" type robot. FIGS. 5 and 6 show a partial top view of a second embodiment of a workpiece handling member 60 without a cover and illustrate the internal working components of the clamp wrist 80 adapted for use on a "polar" type robot. FIGS. 3 and 5 show clamp fingers 90 in an extended, or release, position in which wafer handling members 60 are fully extended so that clamp fingers 90 are disengaged from wafer 302 for loading or unloading of wafer 302.

Each of the workpiece handling members 60 has a wrist housing 199, a wafer handling blade 64 and a clamp wrist 80. The wrist housing 199 may include a top cover plate and a bottom cover plate that encase the internal moving components of the workpiece handling member 60. The housing 199 is substantially rigid and is adapted to protect the workpiece handling member 60 components. The handling blade 64 extends from the forward end of the wrist housing 199 as an integral part thereof and is adapted to receive a wafer 302 thereon. A bridge, or retaining member, 70 (shown in FIGS. 1 and 2) extends upwardly from the end of the wafer blade 64 opposite the wrist housing 199 at the distal end of the wafer handling blade 64, and is adapted to abut a wafer 302 disposed on the blade. An alternative embodiment discussed below with reference to FIGS. 17 and 18 includes a second set of clamp fingers at the distal end of the workpiece handling member 60.

The clamp wrist 80 of the workpiece handling member 60 is comprised of a lever arrangement 109, a biasing member 114, and a pair of clamp fingers 90. The biasing member 114 preferably is a spring connected between the pair of clamp fingers 90.

Figures 14, 15:
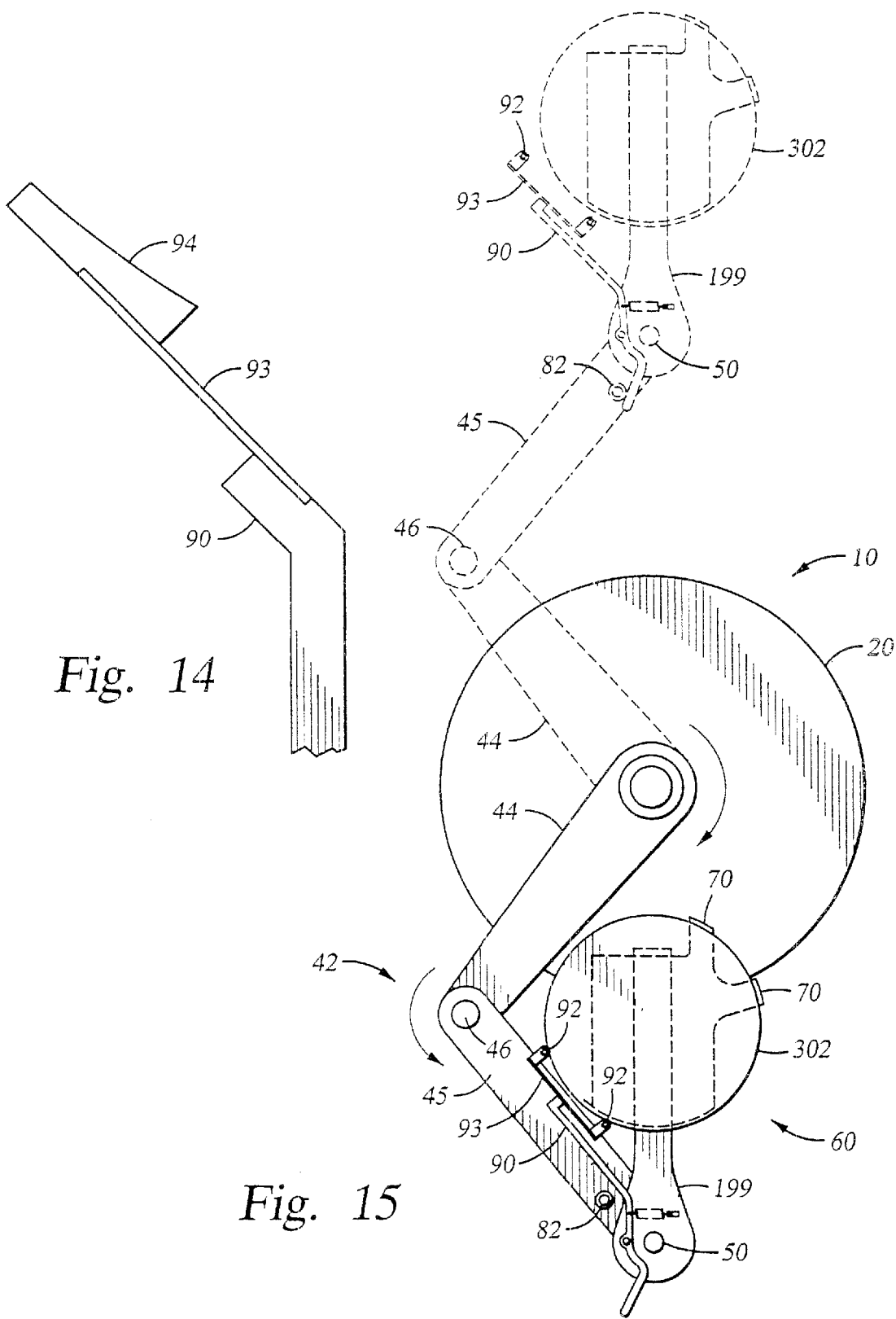
FIG. 14 is a fragmentary view of a portion of an embodiment of clamp finger 90 showing a machined tip end in place of a roller.
FIG. 15 is a top schematic view of a "polar" type robot arm for wafer handling showing the robot in retracted position and also showing the robot in extended position in phantom, utilizing a single clamp finger.
Figure 16:
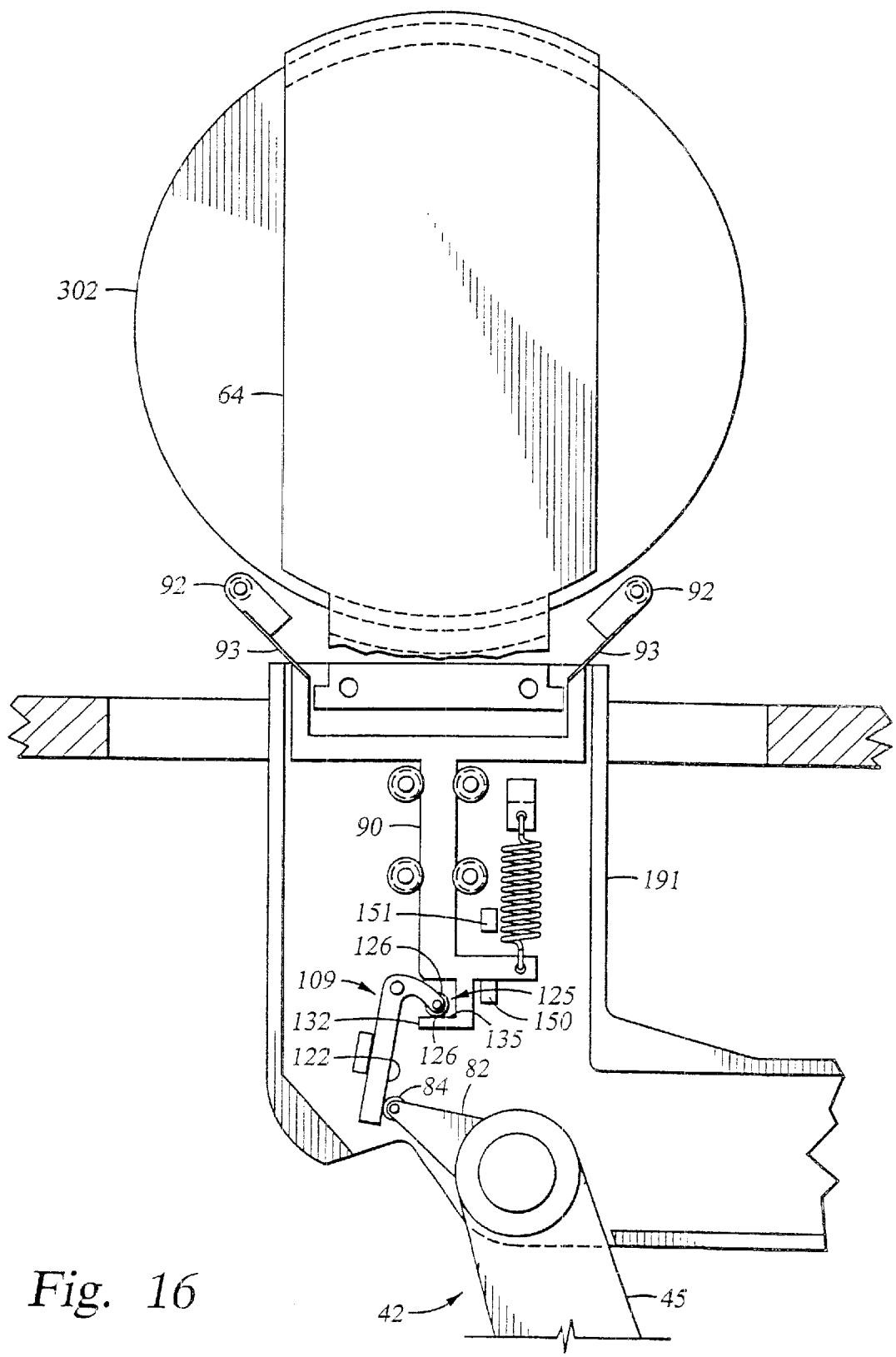
FIG. 16 is a top view of the clamp wrist assembly of a "frog-leg" type robot with no cover plate, showing an embodiment utilizing a single clamp finger.

The pair of clamp fingers 90 are preferably pivotally mounted to and disposed within wrist housing 199 in spaced relation to one another. The two clamp fingers 90 are preferably coupled together by means of biasing member 114, to bias the clamp fingers 90 in a direction generally towards the workpiece, or wafer, 302. The clamp fingers 90 are selected so that, when the clamping mechanism is in a clamped position, the clamp fingers 90 engage the edge of the wafer 302. The distal ends of the clamp fingers 90 preferably include machined tip ends 94 or rollers 92 formed of a hard, wear-resistant material to minimize the friction between the clamp fingers 90 and the wafer 302, thereby minimizing particle generation. Further, tip flexure members 93 may be provided proximate the distal ends of the clamp fingers 90 to absorb shock from the force of the clamp fingers 90 as they engage the wafer 302 to further minimize particle generation and/or to maintain additional clamping force between the clamp fingers 90 and the wafer 302. As shown in FIGS. 15 and 16, it should be noted that a single clamp finger 90 may also be provided having multiple tip ends 94 or rollers 92 for engagement with wafer 302. In the embodiments shown in FIGS. 15 and 16, retaining member 70 may be located at a suitable position proximate the distal end of wafer handling blade 64 opposite rollers 92 or tip ends 94 to secure wafer 302 on the blade, in which event the retaining member 70 may not be located at the distal end of the wafer handling blade 64, but instead may be located anywhere along the periphery of the wafer 302 so long as it is generally opposite rollers 92 or tip ends 94. As shown in the embodiment illustrated in FIG. 16, a single clamp finger 90 may also be slidably mounted to the clamp wrist 80.

In the particular embodiment shown in FIGS. 3 and 4, the lever assembly, or lever arrangement 109 generally includes a first lever 120 which is an elongated lever having opposing ends. One end of the first lever 120 is fixedly or integrally connected to a first clamp finger 90. Opposite the fixed or integral connection end 121 of the first lever 120, the contact end 124 of the first lever 120 has a relatively flat portion associated therewith that defines a contact pad 122. A translational member 125 may also be attached to first lever 120 for engagement with a contact pad 135 of second lever 130 described below. Although not shown, it should be noted that translational member 125 may be connected with second lever 130 instead of first lever 120 so that contact pad 135 of second lever 130 will be a second contact pad 135 connected with first lever 120. The lever assembly, or lever arrangement 109, may also include a second lever 130 which may be an elongated lever that is fixedly or integrally connected to a second clamp finger 90 at a connection end 131 and having a contact end 132 opposite its connecting end 131. The first and second levers, 120 and 130, are provided in angular relation and are adapted to pivot in the same plane along with the first and second clamp fingers 90, respectively. The translational member 125 of the first lever 120 is adapted and positioned to abut and maintain contact between the contact pad 135 associated with the contact end 132 of the second lever 130 as the first lever 120 and the translational member 125 affixed thereto rotates in a forward direction. To minimize the friction and resulting particle generation between the contact pad 135 of the second lever 130 and the translational member 125 of the first lever 120, the translational member 125 of the first lever 120 preferably includes a contact roller 126 rotatably attached thereto that is formed of a hard, wear-resistant material. In operation, pivotal movement of the first lever 120 and the translational member 125 connected thereto causes pivotal movement of the second lever 130. A translational member 82 attached to the second strut 45 of the robot arm 42 is adapted to selectively mate with and engage the contact pad 122 of the first lever 120 to pivot the first clamp finger 90 away from the wafer 302 at a given degree of robot arm extension.

The translational member 82 is an elongated rigid member fixedly attached to the second strut 45 near the pivot 50 connecting the second strut 45 to the workpiece handling member 60. The translational member 82 extends outwardly from the second strut 45 into the wrist housing 199. Rotatably attached to an apogee end of the translational member 82 is a roller 84 adapted to abut another surface without generating substantial particles. The roller 84 is preferably formed of a hard, wear-resistant material to minimize the friction between the translational member 82 and the contact pad 122. The translational member 82 is adapted and positioned so that its apogee end will abut the contact pad 122 of the first lever 120 as the apogee end of the translational member 82 rotates and moves generally forwards, towards the wafer 302 and the handling blade 64. Extension of the robot arm 42 causes a forward rotation of the translational member 82.

As translational member 82 mates and engages the contact pad 122 of the first lever 120 at a given degree of robot arm extension, the translational member 125 of the first lever 120 similarly mates and engages with contact pad 135 of second lever 130 to pivot the second clamp finger 90 away from the wafer 302 at a given degree of robot arm extension. Preferably, the translational member 125 of first lever 120, the contour of contact pad 135 of second lever 130, and the shapes of first and second clamp finger 90 are selected so that the angle of rotation of both the first and second clamp fingers 90 are the same at all times.

Referring now to the embodiment shown in FIGS. 5 and 6, the translational member 82 is fixedly attached to the second strut 45 near the pivot 50 connecting the second strut 45 to the workpiece handling member 60. Rotatably attached to the translational member 82 is a roller 84 adapted to abut another surface without generating substantial particles. The roller 84 is preferably formed of a hard, wear-resistant material such as, for example PEEK (polyethyl ether ketone), or TUFSAM (teflon impregnated anodization coated aluminum), to minimize the friction between the translational member 82 and the contact pad 122. The translational member 82 is adapted and positioned so that it will abut the contact pad 122 of the first lever 120 as the second strut 45 and the translational member 82 affixed thereto rotate with respect to wafer handling member 60 at or near full extension of wafer handling member 60. Extension of the robot arm 42 causes a rotation of the first lever 120 to pivot the first clamp finger 90 away from the wafer 302 at a given degree of robot arm extension.

As translational member 82 mates and engages the contact pad 122 of the first lever 120 at a given degree of robot arm extension, the translational member 125 of the first lever 120 similarly mates and engages with contact pad 135 of second lever 130 to pivot the second clamp finger 90 away from the wafer 302 at a given degree of robot arm extension. Preferably, the translational member 125 of first lever 120, the contour of contact pad 135 of second lever 130, and the shapes of first and second clamp fingers 90 are selected so that the angle of rotation of both the first and second clamp fingers 90 are the same at all times.

FIGS. 3 and 4 are bottom views of the clamp wrist 80 with the bottom cover plate 202 removed and show the clamp wrist 80 operation with the robot arms 42 of a "frog-leg" type robot in an extended and retracted position, respectively. Similarly, FIGS. 5 and 6 are top views of the clamp wrist 80 with no cover plate, and show the clamp wrist 80 operation with the robot arms 42 of a "polar" type robot in an extended and retracted position, respectively. The comparison of the figures is useful to show how the clamp mechanism releases the wafer at full extension. FIGS. 4 and 6 show the wrist assembly 60 in a fully retracted position over the hub of the robot, such as when the assembly is in position for rotation. The clamp fingers 90 are engaged against the perimeter of the wafer 302 in the clamped position. The engagement of the clamp fingers 90 not only clamps the wafer 302, but also consistently and accurately positions the wafer on the blade 64. Because the wafer 302 is accurately positioned, there are fewer handling errors and no need to use sophisticated wafer. center finding equipment, although such equipment could still be used. When the wrist 80 is fully retracted, the proximal distance between the translational member 82 and the mating contact pad 122 of first lever 120 is at a maximum.

FIGS. 3 and 5 show the blade 64 and wrist 80 extended through a wafer transfer slot 410 in a wall 412 of a chamber 404 (FIG. 2) to a point where the clamping mechanism is released. Note the gaps between the rollers 92 of clamp fingers 90 and the edge of the wafer 302 that allow the wafer to be lifted from the top of the blade 64 by another apparatus, such as lift pins of a processing chamber (not shown). It is also instructive to note the relative positions of the translational members 82, 125, the levers 120, 130, stop members 150, 151 (described below), and the spring, or other biasing member, 114. In this release position, the spring, or other biasing member, 114 is extended. The spring, or other biasing member, 114 normally biases the contact fingers 90 in a direction generally toward wafer 302 to engage with and secure wafer 302 against retaining member 70 when the wrist assembly 60 is in a filly retracted position over the hub of the robot, such as when the assembly is in position for rotation (FIGS. 4 and 6). However, the force of translational member 82 as it engages with the lever arrangement 109 acts against the biasing force of the spring, or other biasing member, 114 to disengage clamp fingers 90 from the wafer 302 at a given degree of robot arm extension.

Outer stop member 150 comprises a fixed stop attached to the top cover plate 200, and limits the outward movement of the first and second clamping fingers 90. The stop member 150 is adapted and positioned to prevent outward motion of the clamping fingers 90 beyond a predetermined position. This position is determined by the required travel away from the wafer 302 of the clamp fingers 90 to desirably release wafer 302. In some instances, the robot 10 must retrieve a misaligned wafer 302 and the clamping mechanism serves to align a wafer 302 as it grips the wafer on the handling blade 64. Thus, the clamp fingers 90 must sufficiently retract to allow a misaligned wafer 302 to be placed on the wafer blade 64. In the preferred embodiment, the outer stop member 150 is positioned to permit the clamp fingers 90 to retract up to 0.160 inches which will accommodate a wafer misalignment of up to 0.080 inches from center. The amount of retraction can be adjusted to accommodate tolerances in specific systems and is specifically limited in one embodiment to obtain substantial life from the spring, or other biasing member, 114, and to prevent damage to tip flexure members 93. However, the amount of retraction can be any amount dictated by the particular system in which the clamping assembly is utilized. Similarly, inner stop member 151 may be provided to limit the inward movement of the first and second clamping fingers 90. The inner stop member 151 is adapted and positioned to prevent inward motion of the clamping fingers 90 beyond a predetermined position to, for example, prevent misalignment of lever arrangement 109.

Figure 7:
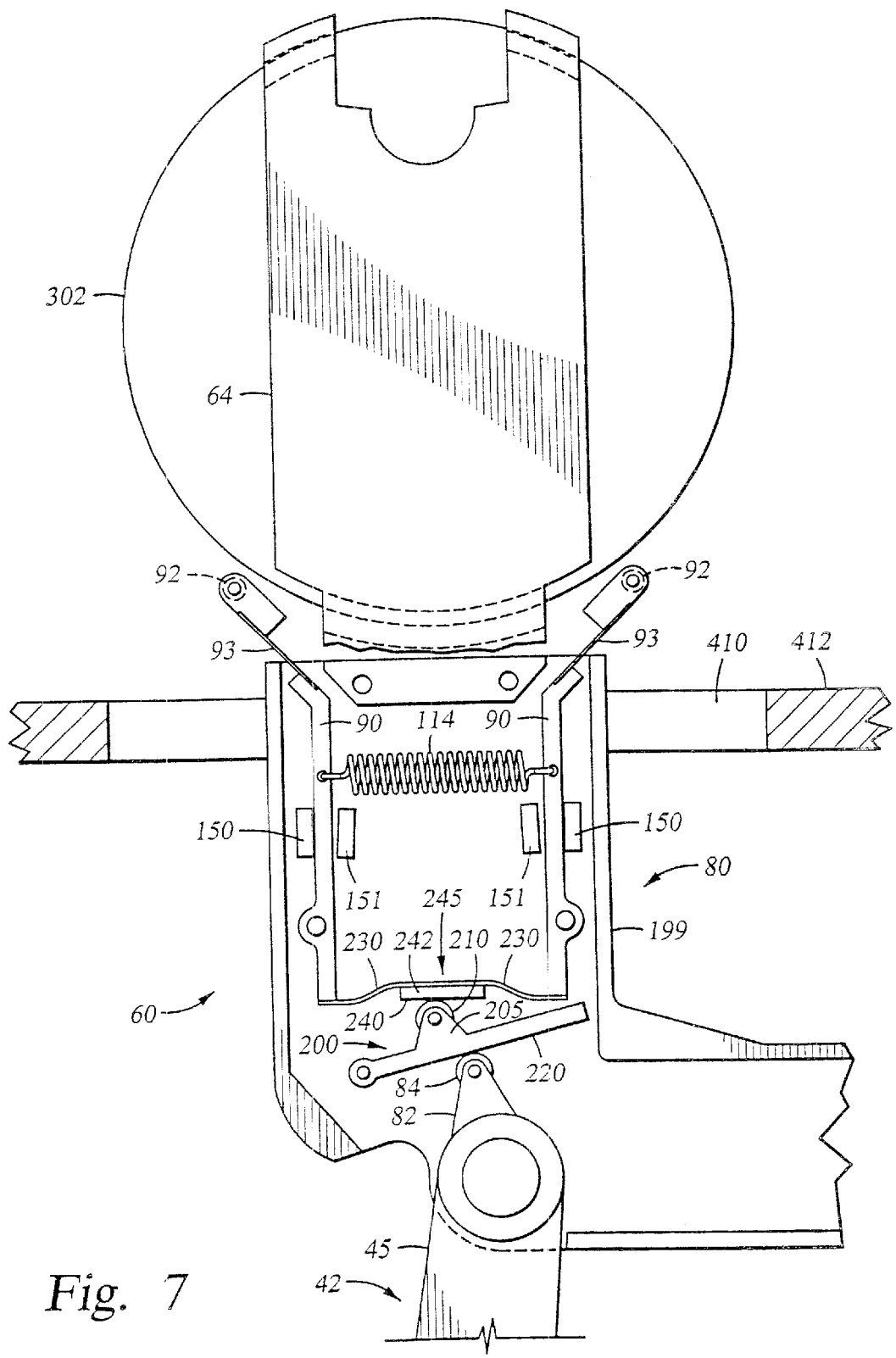
FIG. 7 is a bottom view of the clamp wrist assembly of a "frog-leg" type robot with the bottom cover plate partially removed, showing a third embodiment of the lever arrangement of the present invention in a release position near full extension.
Figure 8:
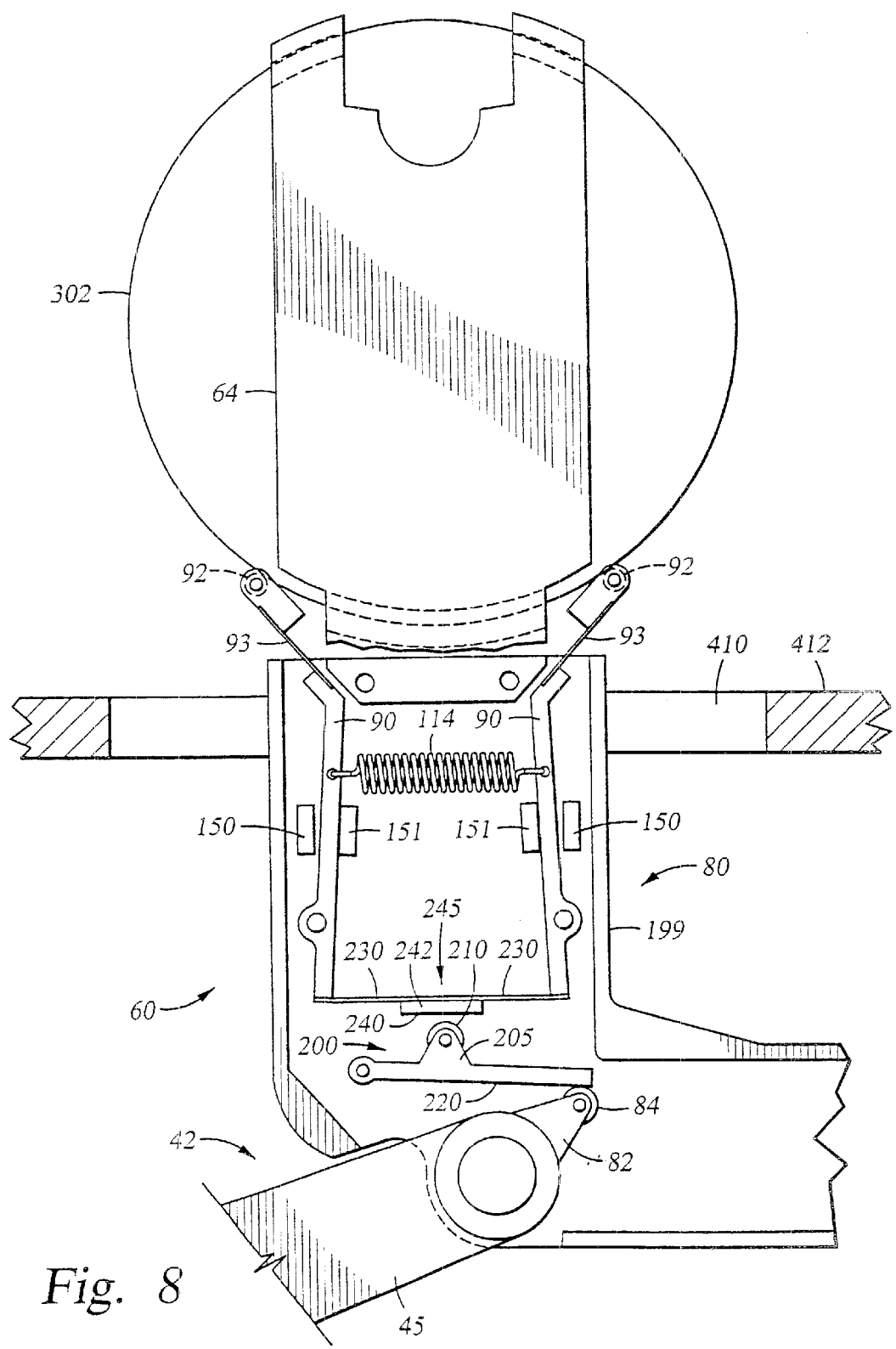
FIG. 8 is a bottom view of the clamp wrist assembly of a "frog-leg" type robot with the bottom cover plate partially removed, showing a third embodiment of the lever arrangement of the present invention in a partially retracted, clamped, position.
Figure 9:
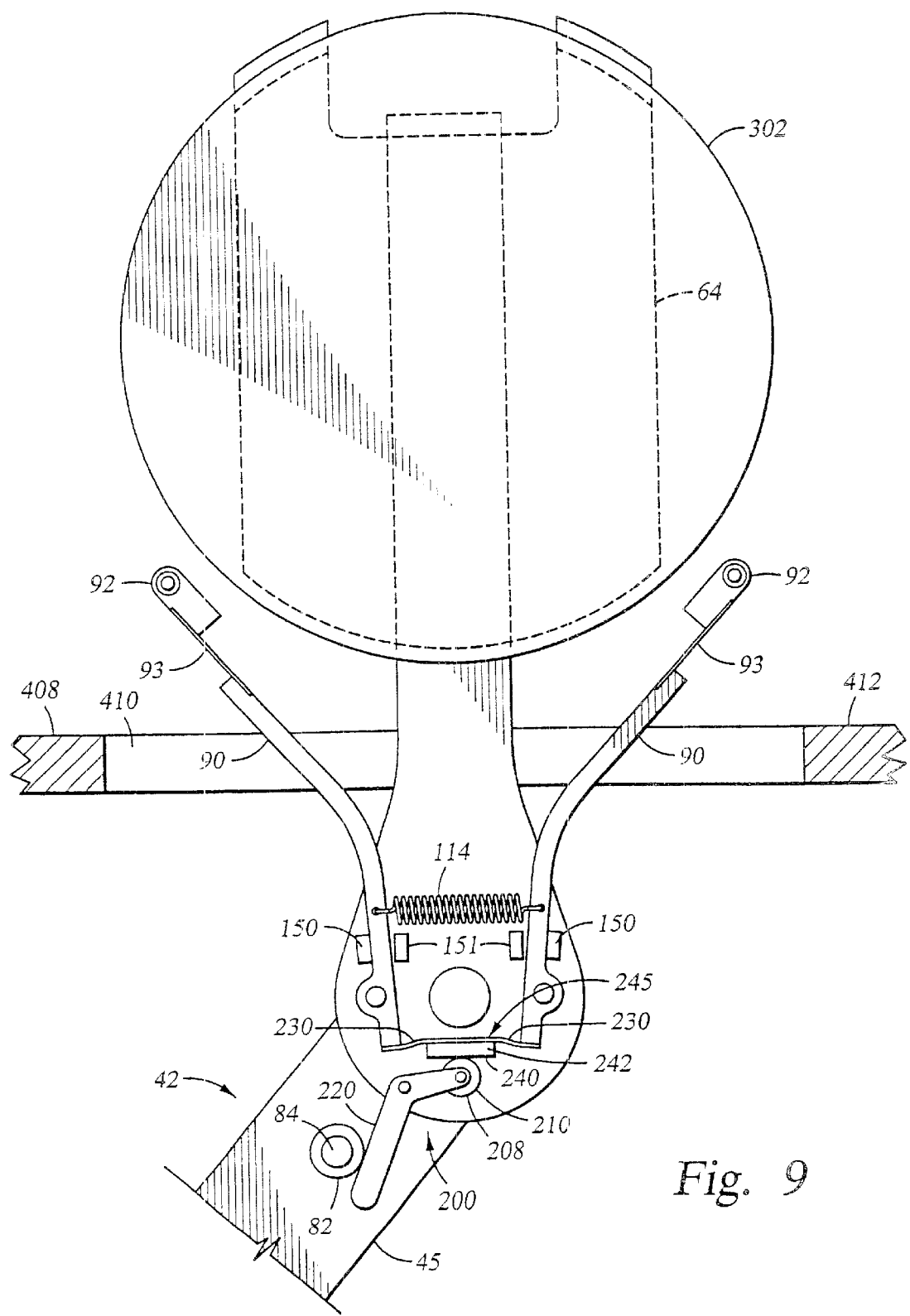
FIG. 9 is a top view of the clamp wrist assembly of a "polar" type robot with no cover plate, showing a fourth embodiment of the lever arrangement of the present invention in a release position near full extension.
Figure 10:
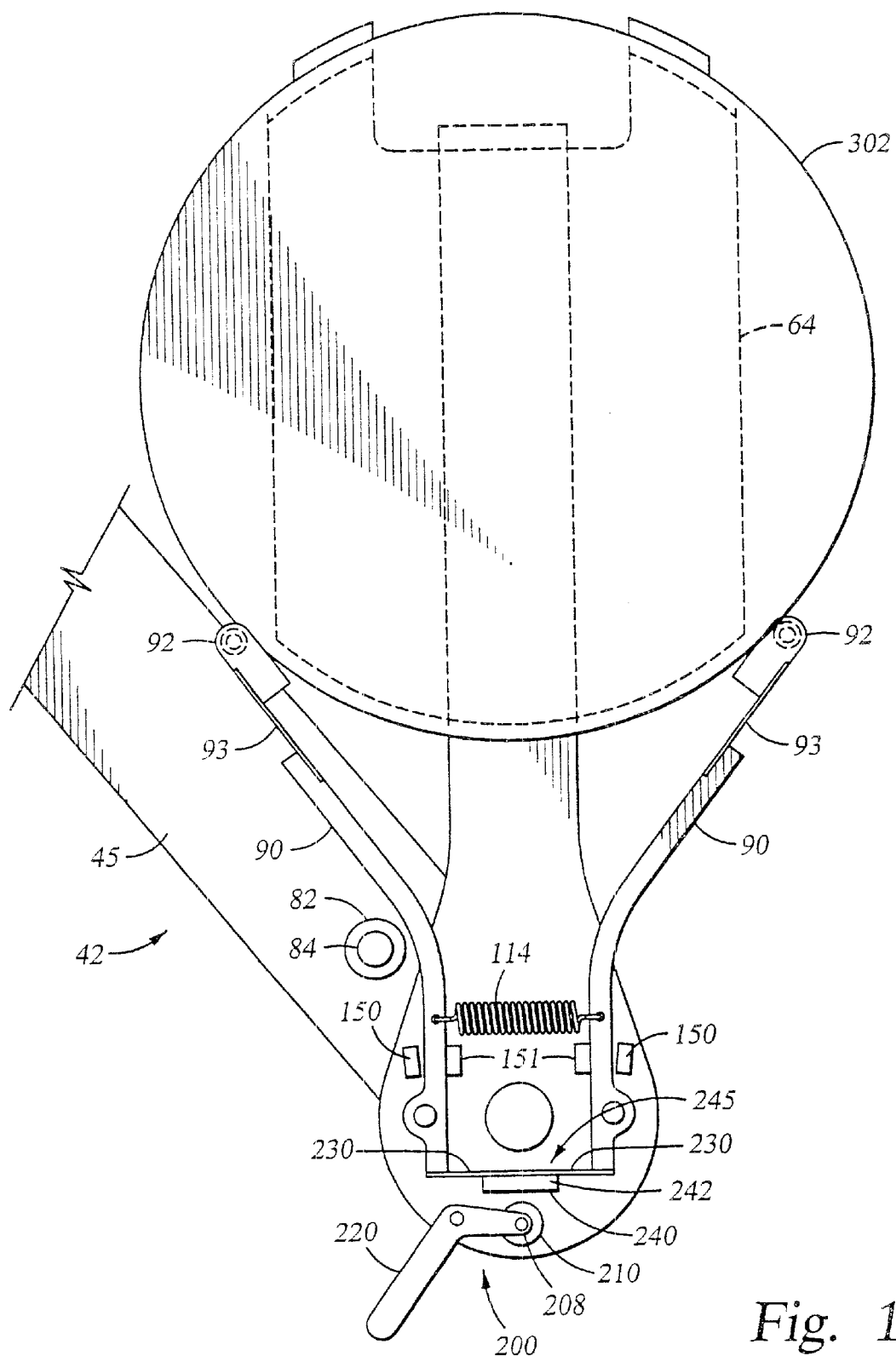
FIG. 10 is a top view of the clamp wrist assembly of a "polar" type robot with no cover plate, showing a fourth embodiment of the lever arrangement of the present invention in a partially retracted, clamped, position.

FIGS. 7 and 8 show a partial bottom view of a third embodiment of workpiece handling member 60 with the bottom plate partially removed and exposing the internal working components of the clamp wrist 80, and is adapted for use on a "frog-leg" type robot. FIGS. 9 and 10 show a fourth embodiment of a workpiece handling member 60 without a cover, exposing the working components of clamp wrist 80 adapted for use on a "polar" type robot. FIGS. 7 and 9 show clamp fingers 90 in an extended, or release, position in which wafer handling members 60 are fully extended so that clamp fingers 90 are disengaged from wafer 302 for loading or unloading of wafer 302.

In the embodiments shown in FIGS. 7–10, the lever assembly, or lever arrangement, 109 generally includes a translational lever 200, which is an elongated lever having opposing ends. A pivoting end of the translational lever 200 is pivotally mounted to and disposed within wrist housing 199 and adapted to pivot in the same plane as clamp fingers 90. Translational lever 200 further comprises a relatively flat portion associated therewith that defines a contact pad 220. A translational member 208 may also be attached to the translational lever 200 for engagement with a contact pad 240 of flexure arrangement 245 described below. Translational member 208 preferably includes a contact roller 210 rotatably attached thereto that is formed of a hard, wear-resistant material such as, for example, PEEK (polyethyl ether ketone), or TUFSAM (teflon impregnated anodization coated aluminum).

Flexure arrangement 245 comprises a central contact portion 242, having opposing ends to which flexure segments 230 are fixedly connected and from which flexure segments 230 extend to and fixedly connect to proximal ends of clamp fingers 90.

The translational member 208 of translational lever 200 is adapted and positioned to abut and maintain contact between the contact pad 240 associated with contact portion 242 of the flexure arrangement 245 as the translational lever 200 and the translational member 208 affixed thereto rotate in a forward direction. In operation, pivotal movement of the translational lever 200 and the translational member 208 connected thereto causes forward movement of the contact portion 242 of the flexure arrangement 245 and associated flexure of flexure segments 230 attached thereto. Forward movement of flexure segments 230 causes inward movement of the ends of clamp fingers 90 to which the flexure segments 230 are attached and cause the clamp fingers 90 to pivot so that the distal ends of clamp fingers 90 move outward away from wafer 302. A translational member 82 attached to the second strut 45 of the robot arm 42 is adapted to selectively mate with and engage the contact pad 122 of the first lever 120 to pivot the first clamp finger 90 away from the wafer 302 at a given degree of robot arm extension.

Referring now to the embodiment shown in FIGS. 7 and 8, the translational member 82 is an elongated rigid member fixedly attached to the second strut 45 near the pivot 50 connecting the second strut 45 to the workpiece handling member 60. The translational member 82 extends outwardly from the second strut 45 into the wrist housing 199. Pivotally attached to an apogee end of the translational member 82 is a roller 84 adapted to abut another surface without generating substantial particles. The roller 84 is preferably formed of a hard, wear-resistant material such as, for example, PEEK or TUFLAM coated aluminum, to minimize the friction between the translational member 82 and the contact pad 122. The translational member 82 is adapted and positioned so that its apogee end will abut the contact pad 220 of the translational lever 200 as the apogee end of the translational member 82 rotates and moves generally forward, towards the wafer 302 and the handling blade 64. Extension of the robot arm 42 causes a forward rotation of the translational member 82.

As translational member 82 mates and engages the contact pad 220 of the translational lever 200 at a given degree of robot arm extension, the translational member 208 of the translational lever 200 similarly mates and engages with contact pad 240 of contact portion 242 to move flexure arrangement 245 forward towards wafer 302 and to thereby pivot clamp fingers 90 away from the wafer 302 at a given degree of robot arm extension. Preferably, the translational member 208 of translational lever 200, the contour of contact pad 220 of translational lever 200, the contour of contact pad 240 of flexure arrangement 245, and the shapes of the clamp fingers 90 are selected so that the angle of rotation of the clamp fingers 90 are the same at all times.

Referring now to the embodiment shown in FIGS. 9 and 10, the translational member 82 is fixedly attached to the second strut 45 near the pivot 50 connecting the second strut 45 to the workpiece handling member 60. Rotatably attached to the translational member 82 is a roller 84 adapted to abut another surface without generating substantial particles. The roller 84 is preferably formed of a hard, wear-resistant material such as, for example, PEEK or TUFLAM coated aluminum, to minimize the friction between the translational member 82 and the contact pad 122. The translational member 82 is adapted and positioned so that it will abut the contact pad 122 of the first lever 120 as the second strut 45 and the translational member 82 affixed thereto rotate with respect to wafer handling member 60 at or near fill extension of wafer handling member 60. Extension of the robot arm 42 causes a rotation of the translational member 82.

As translational member 82 mates and engages the contact pad 122 of the first lever 120 at a given degree of robot arm extension, the translational member 125 of the first lever 120 similarly mates and engages with contact pad 135 of second lever 130 to pivot the second clamp finger 90 away from the wafer 302 at a given degree of robot arm extension. Preferably, the translational member 125 of first lever 120, the contour of contact pad 135 of second lever 130, and the shapes of first and second clamp finger 90 are selected so that the angle of rotation of both the first and second clamp fingers 90 are the same at all times.

FIGS. 7 and 8 are bottom views of the clamp wrist 80 with the bottom cover plate 202 removed and show the clamp wrist 80 operation with the robot arms 42 of a "frog-leg" type robot in an extended and retracted position, respectively. Similarly, FIGS. 9 and 10 are top views of the clamp wrist 80 with no cover plate, and show the clamp wrist 80 operation with the robot arms 42 of a "polar" type robot in an extended and retracted position, respectively. The comparison of the figures is useful to show how the clamp mechanism releases the wafer at full extension. FIGS. 8 and 10 show the wrist assembly 60 in a fully retracted position over the hub of the robot, such as when the assembly is in position for rotation. Note that the clamp fingers 90 are engaged against the perimeter of the wafer 302 in the clamped position. The engagement of the clamp fingers 90 not only clamps the wafer 302, but also consistently and accurately positions the wafer on the blade 64. Because the wafer 302 is accurately positioned, there are fewer handling errors and no need to use sophisticated wafer center finding equipment, although such equipment could still be used. Also note that when the wrist 80 is fully retracted, the proximal distance between the translational member 82 and the mating contact pad 220 of translational lever 200 is at a maximum. Similarly, the proximal distance between the translational member 208 of translational lever 200 and the mating contact pad 240 of flexure arrangement 245 is at a maximum.

FIGS. 7 and 9 show the blade 64 and wrist 80 extended through a wafer transfer slot 410 in a wall 412 of a chamber 404 (FIG. 2) to a point where the clamping mechanism is released. Note the gaps between the rollers 92 of clamp fingers 90 and the edge of the wafer 302 that allow the wafer to be lifted from the top of the blade 64 by another apparatus, such as lift pins of a processing chamber (not shown). It is also instructive to note the relative positions of the translational members 82 and 208, translational lever 200, flexure arrangement 245, flexure segments 230, stop members 150, 151, and the spring, or other biasing member, 114. In this release position, the spring, or other biasing member, 114 is extended. The spring, or other biasing member, 114 normally biases the contact fingers 90 in a direction generally toward wafer 302 to engage with and secure wafer 302 against retaining member 70 when the wrist assembly 60 is in a fully retracted position over the hub of the robot, such as when the assembly is in position for rotation (FIGS. 8 and 10). However, the force of translational member 82 as it engages with the translational lever 200 and the resultant force of translational lever 200 as it engages with the flexure arrangement 245 acts against the biasing force of spring, or other biasing member, 114 to disengage clamp fingers 90 from the wafer 302 at a given degree of robot arm extension.

Outer stop member 150 comprises a fixed stop attached to the top cover plate 200, and limits the outward movement of the first and second clamping fingers 90. The stop member 150 is adapted and positioned to prevent outward motion of the clamping fingers 90 beyond a predetermined position. This position is determined by the required travel away from the wafer 302 of the clamp fingers 90 to desirably release wafer 302. In some instances, the robot 10 must retrieve a misaligned wafer 302. The clamping mechanism serves to align these wafers 302 as it grips them on the handling blade 64. Thus, the clamp fingers 90 must sufficiently retract to allow a misaligned wafer 302 to be placed on the wafer blade 64. In the preferred embodiment, the outer stop member 150 is positioned to permit the clamp fingers 90 to retract up to 0.160 inches which will accommodate a wafer misalignment of up to 0.080 inches from center. The amount of retraction can be adjusted to accommodate tolerances in specific systems and is specifically limited in one embodiment to obtain substantial life from spring, or other biasing member, 114, and to prevent damage to tip flexure members 93. However, the amount of retraction can be any amount dictated by the particular system in which the clamping assembly is utilized. Similarly, inner stop member 151 may be provided to limit the inward movement of the first and second clamping fingers 90. The inner stop member 151 is adapted and positioned to prevent inward motion of the clamping fingers 90 beyond a predetermined position to, for example, prevent misalignment of lever arrangement 109.

FIGS. 11 and 12 are top and side cross sectional views of a wafer blade 64 having a plurality of wafer support members 74. The wafer support members 74 are coupled to, or integrally formed in, the wafer blade 64 and have a wafer contact surface 76 that extends upward a sufficient distance above the top surface of the wafer blade 64 to prevent the bottom surface of the wafer 302 from contacting the top surface of wafer blade 64. In this manner, the wafer support members 74 reduce the degree to which the bottom surface of the wafer 302 is contacted and rubbed, thereby decreasing the likelihood or degree of particle generation and/or wafer damage.

Although a wafer could be supported on as few as three wafer support members 74, it is preferred that the wafer blade 64 include at least four wafer support members 74. It is also generally preferred that the wafer support members 74 be spread out by as great a distance as is practical in order to provide stability to the wafer 302 received thereon, even though additional stability will be provided when the wafer is clamped. A plurality of support members 74 which preferably have a convex surface with a large radius reduce the contact pressure with the underside surface of the wafer 302 thereby further reducing the possibility of particle generation. Further, it should be noted that the blades of the robot may also be sloped so that the wafer has only edge contact with the blade. This may serve to reduce the friction between the wafers and the blades, thereby reducing the force required to push the wafers into position.

While the support members 74 may be made from any material, it is generally desirable to select a material that does not corrode in the process environment, erode or generate particles therefrom, and does not damage the wafer surface. Materials preferred for use as support members include alumina, blue sapphire, zirconia, silicon nitride and silicon carbide. The support members 74 may also be made from a machined metal having a ceramic, sapphire or diamond coating disposed thereon.

FIG. 13A is a magnified partial cross sectional view of the wafer blade 64 and a wafer support member 74 as indicated in FIG. 9. The support member 74 in FIG. 13A is shown as a ball bearing that can rotate within bearing surface 78. Because the bearings are free to rotate or roll, the degree of friction between the member 74 and the wafer 302 may be further reduced or eliminated.

FIGS. 13B and 13C are partial cross sectional views of alternative support members 74 that may be used instead of or in combination with the support member 74 shown in FIG. 13 A. The support member 74 of FIG. 13B comprises a post that is rigidly received within a hole in the blade 64 and a semi-spherical button which. forms the top surface 76 that contacts the wafer 302. The support member 74 of FIG. 13 C is a ball or sphere that is rigidly secured within a hole in the blade so that the top surface 76 extends slightly above the top surface 66 of the blade 64. Each of the designs in FIGS. 13A, 13B, and 13C or their equivalents may be used alone or in combination to provide support for the wafer 302.

Method of Operation

In operation, the robot 10 rotates about its axis within the transfer chamber 406 to align the wafer handling members 60 with the various chambers 404 attached to the transfer chamber 406. Once aligned with a chamber 402 and 404, the robot arms 42 extend, by relative rotation of the first and second struts, 44 and 45, moving the wafer handling members 60 and the wafers 302 resting thereon into the chamber 404 for transfer. To facilitate faster transfer of the wafers 302 between the chambers 404, the wafers 302 are clamped on the wafer handling members 60 when resting thereon. The clamp wrist 80 used to facilitate this clamping operates as follows. While the following description refers to only a single robot arm 42, clamp wrist 80, and workpiece handling blade 64 for ease of description, it should be understood that operation of dual blades occurs in the same manner at each blade.

During wafer transfer on the wafer handling member 60, the spring, or other biasing member 114 biases the clamp fingers 90 into the clamping position. Only when a sufficient force is applied to the spring, or other biasing member, 114, will the attached clamp fingers 90, move outward and away from the wafer 302. In the preferred embodiment, the spring, or other biasing member, 114 exerts a clamping force on the wafer 302 of approximately 0.14 pounds, or about 1.2 times the weight of the wafer 302. Because the size of the wafers 302 are substantially constant, the clamping position of the clamp fingers 90 does not need to change. Thus, the clamp wrist 80 limits the inward and outward travel of the clamp finger 90. Using the apparatus described, which connects the two contact fingers 90 associated with each wafer 302, both of the clamp fingers 90 can be retracted using the motion of a single robot arm 42.

Accordingly, the spring, or other biasing member, 114, biases the clamp fingers 90 to an inward, clamped position in contact with a wafer 302 on the wafer handling blade 64. However, in order to place the wafer 302 on and remove the wafer 302 from the wafer handling blade 64, the clamping action must be released and the clamping fingers 90 retracted. The majority of the time that the wafer 302 is on the blade 64, the robot 10 is moving the wafer 302. To maximize the efficiency of the robot transfer, the wafer 302 is clamped as long as possible while it is on the handling blade 64 so that the robot 10 can use higher velocities and greater accelerations and decelerations to move the wafer 302 faster. Therefore, the clamping force is released only to accomplish wafer transfer between the wafer handling blade 64 and the chamber 404. As such, the clamping force is released only when the robot arms 42 are extended into the chamber 404 to complete the transfer.

As the robot arms 42 extend into the chamber 404 to complete the transfer between the robot 10 and the chamber 404, the struts, 44 and 45, rotate relative to the workpiece handling member 60. This rotation of the second strut 45 causes a relative rotation of the translational member 82 fixedly attached thereto. The translational member 82 is positioned and adapted so that, when the second strut 45 reaches a predetermined degree of rotation which translates to a given extension of the robot arms 42, the roller 84 attached to the apogee end of the translational member 82 contacts the contact pad 122 of the first lever 120 causing a pivot of the first lever 120 on continued extension of the robot arm 42. Accordingly, the translational member 82 translates the extending motion of the robot arm 42, and the rotational motion of the struts, 44 and 45, into a forward rotation of the first lever 120. The translational member 125 of the first lever 120 then engages the contact pad 135 of second lever 130, which also biases the second lever 130 forward causing forward rotation of the second lever 130. As the first lever 120 and second lever 130 rotate forward, they cause the attached contact fingers 90 to move away from the wafer 302 and the handling blade 64. The wafer 302 may then be removed from the wafer handling blade 64. The subsequent retraction of the robot arms 42 causes the translational member 82 to disengage the first lever 120, and allow the spring, or other biasing member, 114 to return the clamp fingers 90 to the clamped position and causing the clamp fingers 90 to engage the edge of the wafer 302 resting on the wafer handling blade 64, thereby pressing the wafer 302 against the retaining member 70. The spring, or other biasing member, 114 thus biases the workpiece handling members 60 to the clamped position. By biasing the wafer 302 against a retaining member 70 fixed to the handling blade 64, the clamping fingers 90 align the wafer 302 to the same position each time a wafer 302 is placed on the handling member 64 and, thereby, increase the repeatability of the system.

Before reaching the position where the clamp fingers 90 retract, the robot movement is slowed to avoid any movement of the wafer 302 on the wafer handling blade 64. When clamped, however, the robot movement speeds, accelerations, and decelerations are limited only by the robot movement capabilities.

One important design consideration of the present invention is that, in some cluster tools 400, as in the one shown in FIG. 2, the processing chambers 404 and the loadlock chamber 402 may or may not be the same distance from the axis x of the robot 10. The present invention accommodates this difference by the use of stop member 150. As the spring, or other biasing member, 114 biases the contact fingers 90 outward, upon reaching a given outward position, the contact fingers 90 contact the stop members 150, which prevents further outward travel of the contact fingers 90. In particular embodiments, lever arrangement 109 may include at least one flexure portion, which may include flexure segments 230 of the embodiment shown in FIGS. 6–7, and 13–14, to absorb any "lost motion" from further travel of robot arm 45.

The exact point at which the clamping mechanism releases the wafer 302 is dependent upon, and may be determined by, the relative sizes and positioning of the various components. For example, the angle at which the translational member 82 is attached to the second strut 45 and the relative position of the contact pad 122 determine the relative position at which they contact one another. The relative lengths of the struts, 44 and 45, determine the relative rotation of the second strut 45 to the workpiece handling member 60. Because the clamp fingers 90 release at a given relative angle between the second strut 45 and the workpiece handling member 60, the lengths of the struts, 44 and 45, must be such that the angle is reached only when the robot arms 42 are extended. Other factors that may affect. the point at which the clamping fingers 90 retract include the tension of the spring 114 and the relative positions of the first lever 120, the second lever 130, and the contact pad 135 of second lever 130. In the preferred embodiment, these components are adapted so that the clamp fingers 90 retract when the wafer handling blade 64 is within 1 to 3 inches of the transfer position (i.e., the fully extended position).

When the clamp fingers 90 engage the wafer 302, the wafer 302, is secured between the fingers 90 and the retaining member 70, then the engagement of the clamp fingers 90 will push the wafer 302 until it moves against the retaining member 70. It is during this movement of the wafer 302 relative to the wafer blade 64 that the bottom surface of the wafer 302 will encounter any frictional forces with the wafer contact surface 76 of the wafer support members 74. However, unlike support members of conventional blades which contact the wafer 302 over a large area, the support members of the present invention reduce or minimize the degree of contact and friction therebetween and, thereby, reduce or eliminate wafer damage or particle generation. Consequently, the wafer support members 74 of the present invention are not relied on to provide friction, but rather to reduce friction and damage to the wafer 302. It is the clamping action of the present invention that holds the wafer 302 in place during movement of the blade 64.

Figure 17:
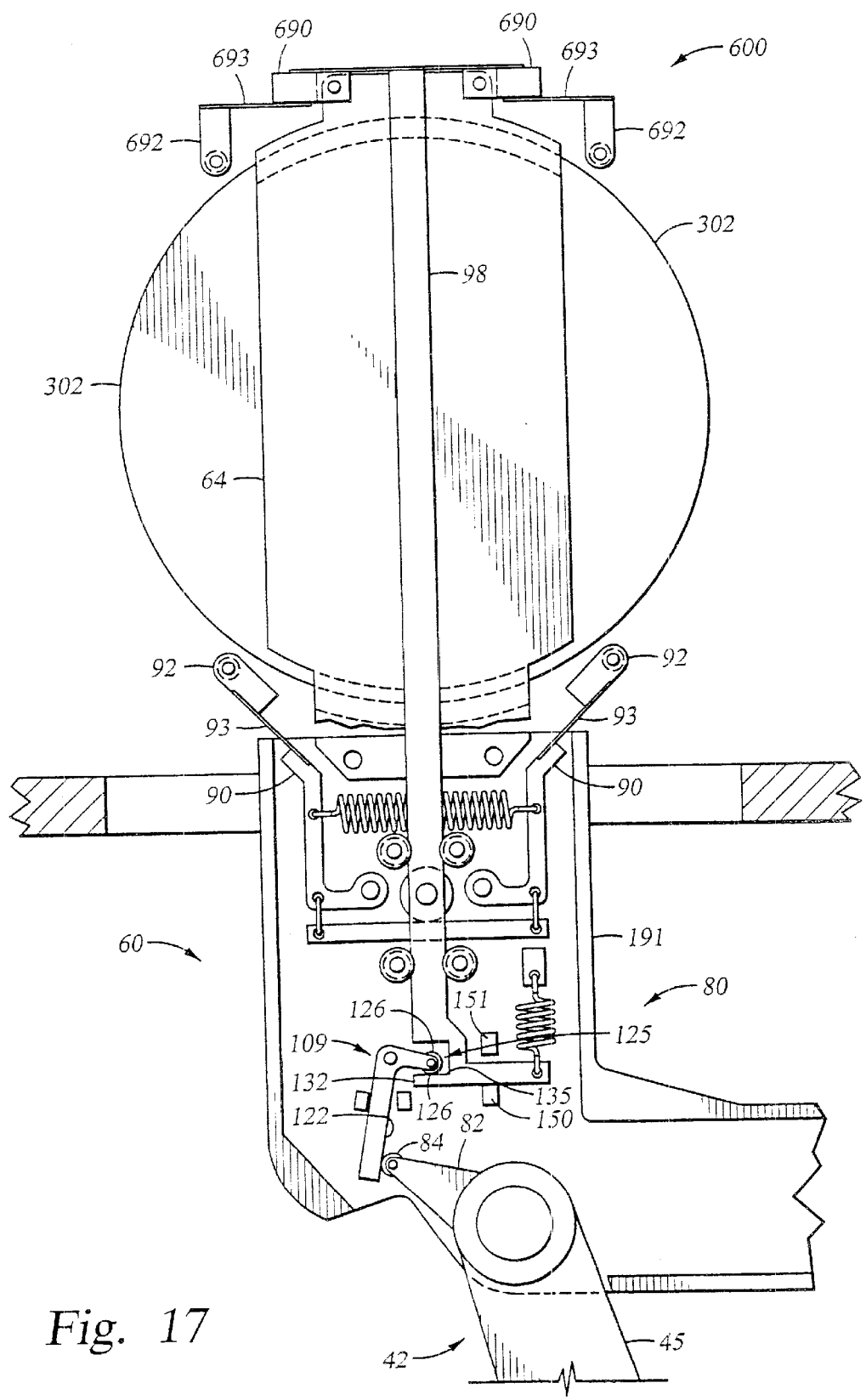
FIG. 17 is a top view of the clamp wrist assembly of a "frog-leg" type robot with no cover plate, showing an embodiment of the lever arrangement of the present invention in a release position near full extension, utilizing opposing sets of clamp fingers on opposing sides of the wafer.
Figure 18:
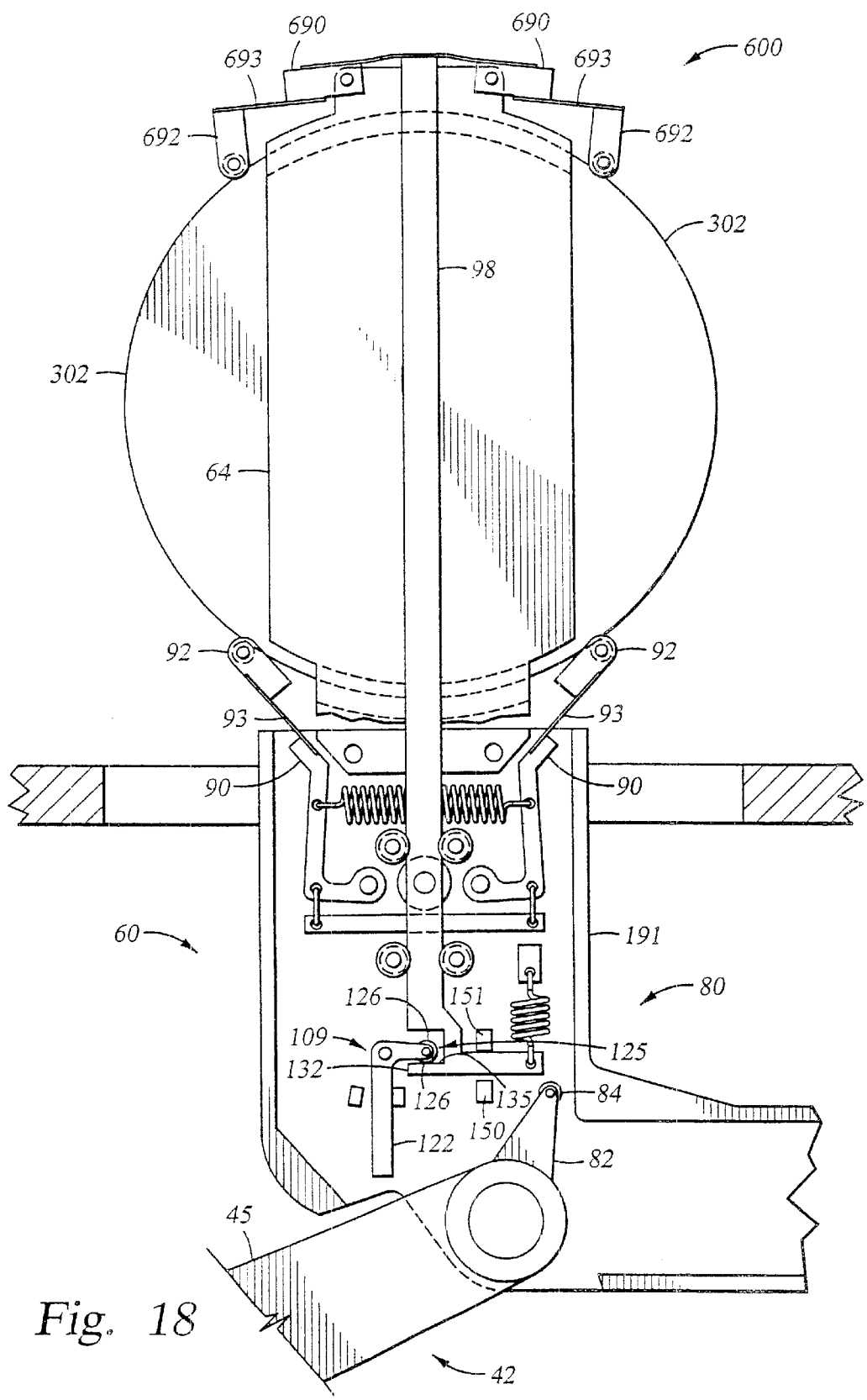
FIG. 18 is a top view of the clamp wrist assembly of a "frog-leg" type robot with no cover plate, showing an embodiment of the lever arrangement of the present invention in a partially retracted, clamped, position, utilizing opposing sets of clamp fingers on opposing sides of the wafer.

Referring now to FIGS. 17 and 18, it should be noted that any of the embodiments of the present invention may also include opposing clamp fingers 90, 690 or sets of clamp fingers 90, 690, which could include a first, proximal, set of clamp fingers 90, and a second, distal, set of clamp fingers 690 located on opposing sides of the wafer 302. FIGS. 17 and 18 show a partial top view of an embodiment of a workpiece handling member 60 with no cover plate illustrating the internal working components of the clamp wrist 80. The embodiment shown in FIGS. 17 and 18 is adapted for use on a "frog-leg" type robot, but it should be noted that opposing sets of clamp fingers 90, 690 could be used in any of the other embodiments described herein. FIG. 17 shows clamp fingers 90, 690 in an extended, or release, position in which wafer handling members 60 are fully extended so that clamp fingers 90, 690 are disengaged from wafer 302 for loading or unloading of wafer 302.

In the embodiment shown in FIGS. 17 and 18, retaining member 70 (shown in FIGS. 1 and 2) is not used. Instead, the wafer 302 is abutted on either side by opposing clamp fingers 90, 690. Preferably, the opposing sets of clamp fingers 90, 690 are operatively connected by common linkage 98, which may be a length of wire, a segment of spring steel, or other suitable member.

In operation of the embodiment shown in FIGS. 17 and 18, the robot 10 rotates about its axis within the transfer chamber 406 to align the wafer handling members 60 with the various chambers 404 attached to the transfer chamber 406. Once aligned with a chamber 402 and 404, the robot arms 42 extend, by relative rotation of the first and second struts, 44 and 45, moving the wafer handling members 60 and the wafers 302 resting thereon into the chamber 404 for transfer. To facilitate faster transfer of the wafers 302 between the chambers 404, the wafers 302 are clamped on the wafer handling members 60 when resting thereon. The clamp wrist 80 used to facilitate this clamping operates as follows. While the following description refers to only a single robot arm 42, clamp wrist 80, and workpiece handling blade 64 for ease of description, it should be understood that operation of dual blades occurs in the same manner at each blade.

During wafer transfer on the wafer handling member 60, the spring, or other biasing member 114 biases a common linkage member 98, which in turn biases the clamp fingers 90, 690 into the clamping position. Only when a sufficient force is applied to the spring, or other biasing member, 114, will the attached clamp fingers 90, 690, move outward and away from the wafer 302. Any number of clamp fingers 690 may be provided on the distal end of the blade 64. Preferably, two clamp fingers 690 are used, which preferably pivot with respect to the blade 64 to allow rotation of the rollers 692 attached thereto towards and away from the wafer 302 in response to axial movement of linkage member 98.

As the robot arms 42 extend into the chamber 404 to complete the transfer between the robot 10 and the chamber 404, the struts, 44 and 45, rotate relative to the workpiece handling member 60. This rotation of the second strut 45 causes a relative rotation of the translational member 82 fixedly attached thereto. The translational member 82 is positioned and adapted so that, when the second strut 45 reaches a predetermined degree of rotation which translates to a given extension of the robot arms 42,the roller 84 attached to the apogee end of the translational member 82 contacts the contact pad 122 of the first lever 120 causing a pivot of the first lever 120 on continued extension of the robot arm 42. Accordingly, the translational member 82 translates the extending motion of the robot arm 42, and the rotational motion of the struts, 44 and 45, into a rearward rotation of the first lever 120. The translational member 125 of the first lever 120 then engages the contact pad 135 of linkage member 98, which also biases the linkage member 98 rearward. As the linkage member 98 is moved rearward, it causes the operatively engaged contact fingers 90, 690 to move away from the wafer 302 and the handling blade 64. The wafer 302 may then be removed from the wafer handling blade 64. The subsequent retraction of the robot arms 42 causes the translational member 82 to disengage the first lever 120, and allow the spring, or other biasing member, 114 to return the clamp fingers 90, 690 to the clamped position and causing the clamp fingers 90 to engage the edge of the wafer 302 resting on the wafer handling blade 64, thereby pressing the wafer 302 against the retaining member 70.

While the foregoing is directed to the preferred embodiment of the present invention, other and further embodiments of the invention may be devised without departing from the basic scope thereof, and the scope thereof is determined by the claims which follow.

What is claimed is:

1. A robot assembly for handling a workpiece, comprising:

one or more arms;

a wrist housing pivotally coupled to at least one of the one or more arms;

at least one clamp finger at least partially disposed in the wrist housing;

a biasing member coupled to the at least one clamp finger for urging the at least one clamp finger against the workpiece;

a contact member movably connected to the at least one clamp finger; and a translational member coupled to the one or more arms, wherein the translational member is adapted to engage the contact member and move the at least one clamp finger.

2. The robot assembly of claim 1, wherein the at least one clamp finger is pivotally mounted to the wrist housing and the contact member is positioned to move the at least one clamp finger away from the workpiece when the one or more arms reach a given degree of extension.

3. The robot assembly of claim 2, further comprising:

a stop member attached to the wrist housing and adapted and positioned to limit the movement of the at least one clamp finger away from the workpiece.

4. The robot assembly of claim 3, wherein the biasing member is at least one spring.

5. The robot assembly of claim 4, further comprising:

two clamp fingers mounted in spaced relation to one another and connected to the at least one spring.

6. The robot assembly of claim 1, wherein the at least one clamp finger includes a first clamp finger and a second clamp finger, the clamp fingers located proximate opposing sides of the wafer.

7. A robot assembly for securing a workpiece, comprising:

a workpiece handling member coupled to a distal end of a robot arm, the workpiece handling member comprising a wafer handling blade having a workpiece receiving region and a retaining member at the distal end thereof;

at least one clamp finger for contacting the edge of the workpiece;

a biasing member coupled to the at least one clamp finger adapted to urge the at least one clamp finger against the workpiece when the workpiece is positioned on the workpiece receiving region to clamp the workpiece between the at least one clamp finger and the retaining member;

a lever arrangement coupled to the at least one clamp finger; and a translational member coupled to the robot arm and used to engage the lever arrangement and move the finger away from the workpiece when the workpiece handling member and the robot arm are extended.

8. The robot assembly of claim 7, wherein the lever arrangement is adapted to be engaged by the relative angular rotation between the robot arm and the workpiece handling member.

9. The robot assembly of claim 8, wherein the at least one clamp finger is pivotally mounted to the workpiece handling member.

10. A robot arm assembly, comprising:

a pair of frog-leg type robot arms, each arm having a distal end with a clamp wrist attached thereto, the clamp wrist comprising:

a wrist housing pivotally coupled to each of the robot arms;

at least one clamp finger disposed in the wrist housing;

a biasing member coupled between the wrist housing and the at least one clamp finger for urging the at least one clamp finger against a workpiece;

a contact member movably connected to the at least one clamp finger; and a translational member coupled to the respective robot arm, wherein the translational member is for engaging the contact member and moving the at least one clamp finger.

11. The robot arm assembly of claim 10, further comprising:

a stop member attached to the wrist housing and adapted and positioned to limit the movement of the at least one clamp finger away from the workpiece.

12. A robot, comprising:

a pair of first hub members rotatable about a first axis;

a pair of magnetic drives for driving each of the hub members;

a pair of robot arms, each robot arm comprising a first and second strut, the first strut mounted to a hub member;

a translational member disposed on each of the second struts;

a workpiece handling member pivotally attached to the pair of robot arms, the workpiece handling member comprising:

at least one clamp finger;

a biasing member coupled to the at least one clamp finger adapted to urge the at least one clamp finger against a workpiece;

a lever arrangement adapted and positioned to engage the at least one clamp finger in response to engagement of the lever arrangement by the translational member when the attached arm assembly reaches a given degree of extension; and the lever arrangement is adapted to pull the at least one clamp finger away from the workpiece when the attached arm assembly reaches a given degree of extension.

13. The robot of claim 12, wherein the biasing member is at least one spring.

14. The robot of claim 13, further comprising:

a stop member attached to the wrist housing and adapted and positioned to limit the movement of the at least one clamp finger away from the workpiece.

15. The robot of claim 14, wherein rotation of the first and second arms in a same direction are converted into one of the two independent motions and rotation of the first and second arms in opposite directions are converted into another of the two independent motions.

* * * * *

UNITED STATES PATENT AND TRADEMARK OFFICE
CERTIFICATE OF CORRECTION

PATENT NO.    : 6,514,033 B2
DATED         : February 4, 2003
INVENTOR(S)   : Sundar It is certified that error appears in the above-identified patent and that said Letters Patent is hereby corrected as shown below:

Column 10,
Line 53, please change "wafer. center" to -- wafer center --.

Column 11,
Line 6, please change "filly" to -- fully --.

Column 15,
Line 15, please change "which. forms" to -- which forms --.

Column 17,
Line 9, please delete the "." after "affect".

Signed and Sealed this

Twenty-second Day of July, 2003

JAMES E. ROGAN
*Director of the United States Patent and Trademark Office*